(12) United States Patent
Kurachi et al.

(10) Patent No.: US 12,396,275 B2
(45) Date of Patent: Aug. 19, 2025

(54) PHOTO DETECTION DEVICE

(71) Applicant: Optohub Co., Ltd, Nagano (JP)

(72) Inventors: Ikuo Kurachi, Tokyo (JP); Hiroshi Takano, Tokyo (JP); Yasumasa Kashima, Tokyo (JP)

(73) Assignee: Optohub Co., Ltd, Nagano (JP)

( * ) Notice: Subject to any disclaimer, the term of this patent is extended or adjusted under 35 U.S.C. 154(b) by 0 days.

(21) Appl. No.: 17/918,111

(22) PCT Filed: Mar. 16, 2022

(86) PCT No.: PCT/JP2022/011878
§ 371 (c)(1),
(2) Date: Oct. 10, 2022

(87) PCT Pub. No.: WO2023/175762
PCT Pub. Date: Sep. 21, 2023

(65) Prior Publication Data
US 2024/0145519 A1    May 2, 2024

(51) Int. Cl.
*H01L 31/18* (2006.01)
*H10F 39/00* (2025.01)
*H10F 39/18* (2025.01)
*H10F 71/00* (2025.01)

(52) U.S. Cl.
CPC ......... *H10F 39/184* (2025.01); *H10F 39/014* (2025.01); *H10F 71/139* (2025.01)

(58) Field of Classification Search
CPC ...... H10F 39/184; H10F 39/18; H10F 39/014; H10F 39/00; H10F 39/024; H10F 71/139;
(Continued)

(56) References Cited

U.S. PATENT DOCUMENTS

2018/0358488 A1    12/2018    Yamashita et al.
2021/0296381 A1    9/2021    Atsuta et al.

FOREIGN PATENT DOCUMENTS

EP          3772104        2/2021
JP       2019533302       11/2019
(Continued)

OTHER PUBLICATIONS

Peter Vines et al., "High performance planar germanium-on-silicon single-photon avalanche diode detectors," Nature Communications, Mar. 2019, pp. 1-9.
(Continued)

*Primary Examiner* — Nikolay K Yushin
(74) *Attorney, Agent, or Firm* — JCIPRNET

(57) ABSTRACT

To provide a photo detection device and a manufacturing method thereof, the photo detection device comprising a SPAD in which a substrate-manufacturing cost is kept sufficiently low compared to InGaAs, afterpulsing is less and DCR is also reduced.

A photo detection device detecting an incident light from an object, comprising: (i) a P-type silicon (Si) substrate; (ii) a P-type germanium (Ge) layer formed by epitaxial growth on a first surface serving as a front surface of the P-type silicon (Si) substrate; and (iii) a P-type thin film silicon (Si) layer formed on the P-type germanium (Ge) layer, (iv) wherein the P-type thin film silicon (Si) layer is divided into a first region and a second region by a Shallow Trench Isolation (STI), multiple single photon avalanche diodes (SPADs) arranged in an array are formed in the first region, and a CMOS transistor circuit driving the SPADs is formed in the second region.

2 Claims, 21 Drawing Sheets

(58) Field of Classification Search
CPC ...... H10F 71/00; H10F 71/165; H10F 71/137;
H10F 39/10; H10F 39/12; H10F 71/121;
H10F 71/1212; H10F 30/225; A23B 2/70;
A23B 2/60; A23B 2/80; A45F 5/155;
A45F 5/00; A61K 40/4252; A61K 40/42;
H10D 30/0289; H10D 30/01; H10D
84/80; H10D 30/00; H10D 12/00; H10D
12/481; H10D 12/031; H10D 84/40;
H10D 84/0149; H10D 84/834; H10H
20/816; H10H 20/018
See application file for complete search history.

(56) References Cited

FOREIGN PATENT DOCUMENTS

| | | |
|---|---|---|
| JP | 2020510308 | 4/2020 |
| JP | 2021027358 | 2/2021 |
| JP | 2021150359 | 9/2021 |
| WO | 2004027879 | 4/2004 |
| WO | 2018042242 | 3/2018 |
| WO | 2018158631 | 9/2018 |

OTHER PUBLICATIONS

F. Gity et al., "Modelling Ge/Si Avalanche Photodiodes," Conference: IEEE European Conference on Integrated Optics (ECIO), Apr. 2010, pp. 1-2.

A. Katz et al., "Active-Reset for the N+P Single-Ended SPAD Used in the NIR LiDAR Receivers," IEEE Transactions on Electron Devices, vol. 66, Dec. 2019, pp. 5191-5195.

Kwang Hong Lee et al., "Comparative Studies of the Growth and Characterization of Germanium Epitaxial Film on Silicon (001) with 0° and 6° Offcut," Journal of Electronic Materials, vol. 42, Mar. 2013, pp. 1-8.

Saloni Chaurasia et al., "Epitaxial germanium thin films on silicon (100) using two-step process," Conference: 2016 3rd International Conference on Emerging Electronics (ICEE), Dec. 2016, pp. 1-4.

PHOTO DETECTION DEVICE

CROSS-REFERENCE TO RELATED APPLICATION

This application is a 371 application of the International PCT application serial no. PCT/JP2022/011878, filed on Mar. 16, 2022. The entirety of the above-mentioned patent application is hereby incorporated by reference herein and made a part of this specification.

TECHNICAL FIELD

The present invention relates to a photo detection device containing multiple photo detection elements that detects a single photon of incident light, in particular, infrared light whose wavelength is about 0.9 to 1.6 μm, from an object, and a driving circuit that drives the photo detection elements.

BACKGROUND ART

Conventionally, a photo detection element capable of detecting a single photon is generally realized as a SPAD (Single Photon Avalanche Diode) using silicon (refer to Patent Document 1).

However, in this case, only a photon with a wavelength (A) shorter than about 1 μm can be detected due to a bandgap (Eg≈1.12 eV) specific to silicon. It is necessary to use a semiconductor with a bandgap narrower than that of silicon as a detection element in order to detect a photon of infrared light whose wavelength is equal to or greater than 1 μm. Thus, indium gallium arsenide (InGaAs) or germanium (Ge) is generally used in order to detect a photon of infrared light whose wavelength is equal to or greater than 1 μm.

There are many crystal defects in the former InGaAs and in particular, deep level traps are formed therein. Thus, it is known that when it is operated as an avalanche photodiode (APD), many faults called afterpulses ("noise") occur.

In addition, InGaAs cannot be produced as a single crystal and are generally formed on an Inp substrate by epitaxial growth using metal organic chemical vapor deposition (MOCVD).

Thus, it is disadvantageous in that a substrate-manufacturing cost becomes expensive.

Furthermore, it is difficult to sufficiently enhance crystal quality.

In addition, it was impossible to integrate a driving circuit for amplifying and processing a signal from an APD with the APD and configure them in the same chip.

In the latter Ge, since an avalanche region has to be formed in Ge and Ge has a narrow bandgap as mentioned above, a thermally excited carrier is easily generated, the carrier causes avalanche amplification, and "photon" counting can be performed even without light, i.e., in the "dark." This is called a dark count rate (DCR) and there was a problem that the DCR could be high.

In addition, for example, when the photo detection device is used as a Laser Imaging Detection and Ranging (LiDAR), two-dimensional range information is needed and multiple SPADs must be arranged in an array. However, in the case of the detection device using InGaAs or Ge, it was difficult to arrange the plurality of SPADs in an array in the same chip.

Non-Patent Document 1 discloses forming a single photon avalanche diode (SPAD) in a germanium (Ge) layer formed on a silicon substrate.

Non-Patent Document 2 discloses a separate absorption, charge and multiplication avalanche photodiode (SACM-APD) that is composed of a Ge absorption layer and an Si multiplication layer, and configured to be separated by a p-doped Si charge layer.

However, the SPAD as disclosed in Non-Patent Documents 1 and 2 is of a single diode structure, multiple diodes are not arranged in an array, and a circuit that drives the SPAD, is not formed on the same substrate.

Non-Patent Document 3 discloses a circuit for active reset of an $N^+P$ single-ended SPAD that is used in an NIR LiDAR receiver. However, it does not disclose in detail how to configure the SPAD and the resetting circuit thereof on the same substrate.

Non-Patent Document 4 discloses a characteristic evaluation result of germanium (Ge) epitaxially grown on a silicon (001) with 0° and 6° offcut.

Non-Patent Document 5 discloses epitaxially growing a germanium (Ge) thin film on a silicon (100) using a two-step process.

Non-Patent Documents 4 and 5 just evaluate a characteristic of the Ge layer epitaxially grown on the silicon layer but do not disclose any structure of the photo detection device.

PRIOR ART LITERATURE

Patent Documents

Patent document 1: Japanese Patent Application Publication No. 2021-150359

Non-Patent Documents

Non-patent document 1: "High performance planar germanium-on-silicon single-photon avalanche diode detectors", Peter Vines, etc. ⌈nature communications, (2019)10; 1086⌋

Non-patent document 2: "Modelling Ge/Si Avalanche Photodiodes", F. Gity etc. ⌈Science Foundation Ireland (SF1) under grand 07/SRC/11173⌋

Non-patent document 3: "Active-Reset for the N+P Single-Ended SPAD Used in the NIR LiDAR Receivers", A. Katz, etc. ⌈IE3 TRANSACTIONS ON ELECTRON DEIVES, Vol. 66, No. 12 Dec. 2019⌋

Non-patent document 4: "Comparative Studies of the Growth and Characterization of Germanium Epitaxial Film on Silicon (001) with 0° and 6° Offcut." Kwang Hong Lee, etc. ⌈Journal of Electronic Materials, vol 42, No. 6, 2013⌋

Non-patent document 5: "Epitaxial Germanium thin films of Silicon (100) using two-step process", Saloni Chaurasia, etc. "VTC from IEEE Xplore"

SUMMARY OF THE INVENTION

Problems to be Solved by the Invention

It is an object of the present invention to provide a photo detection device and a manufacturing method thereof, the photo detection device comprising a SPAD in which a substrate-manufacturing cost is kept sufficiently low compared to InGaAs, afterpulsing is less and DCR is also reduced.

Furthermore, it is also an object of the present invention to provide a photo detection device and a manufacturing method thereof, the photo detection device in which a silicon-based CMOS transistor circuit that drives multiple SPADs arranged in an array can be arranged and placed on the same substrate.

Means for Solving the Problems

The photo detection device of the present invention is made based on a structure comprising a P-type silicon (Si) substrate, a P-type germanium (Ge) layer formed by epitaxial growth on the silicon (Si) substrate, and a P-type silicon (Si) bonded on the germanium (Ge) layer by surface activated bonding, wherein the P-type silicon (Si) is thinned to 0.8 µm to 1.2 µm by smart-cut technique using hydrogen ion implantation.

In the thinned P-type silicon (Si), multiple SPADs arranged in an array which SPAD detects infrared light and a CMOS transistor circuit that drives the SPADs and amplifies/processes detected signals are formed by ion implantation.

In an avalanche diode part of the P-type silicon (Si), an APD P-well layer doped by ion implantation of group III impurity such as boron and an APD N-well layer doped by ion implantation of group V impurity such as phosphorus are formed, and in the APD N-well layer, an $N^+$ diffusion layer heavily doped with group V impurity such as arsenic is formed in order to sufficiently lower contact resistance. In addition, around the $N^+$ diffusion layer, an NW guard ring layer that prevents edge breakdown is provided by ion implantation.

In an N-channel transistor part, there is a P-well layer by ion implantation of group III such as boron, and in the P-well layer, there is an $N^+$ diffusion layer that constitutes a source and a drain and is formed by ion implantation of group V such as arsenic. Furthermore, a $P^+$ diffusion layer is also formed that is to contact the P-well layer and is formed by ion implantation of such as boron. Similarly, in a P-channel transistor part, an N-well layer, $P^+$ diffusion layer, and $N^+$ diffusion layer are formed by ion implantation.

A method of forming these transistors follows an existing method of manufacturing a logic LSI and can facilitate manufacture of the photo detection device of the present invention and lower the manufacturing costs.

Advantageous Effect of the Invention

According to the photo detection device of the present invention, causing carrier generation due to photoelectric effect of infrared light within a germanium depletion layer and causing an avalanche of this generated carrier at a PN junction part in a high-quality silicon allow a reduction of the DCR that is noise of the SPAD and also a reduction of afterpulsing. In addition, avalanche diodes are separated from each other, and thus it becomes possible to arrange multiple avalanche diodes in an array and it becomes possible to make a two-dimensional image sensor in one chip.

Furthermore, since a general silicon CMOS circuit can be easily mounted, not only a sensor diode but also a circuit for amplifying/processing an electrical signal that is output from a sensor can be mounted in one chip, which allows reduction in size and cost of the device.

Additionally, a method of manufacturing the photo detection device of the present invention is substantially the same as a normal CMOS logic process, and thus ease of manufacture and cost reduction are assured.

BRIEF DESCRIPTION OF THE DRAWINGS

FIG. 4(l) is an outline cross-sectional view (part 12) illustrating a wafer process for a photo detection device capable of detecting an infrared single photon.

MODE FOR CARRYING OUT THE INVENTION

Embodiments of the present invention will be described in detail below with reference to the attached drawings.

Figure 1A:
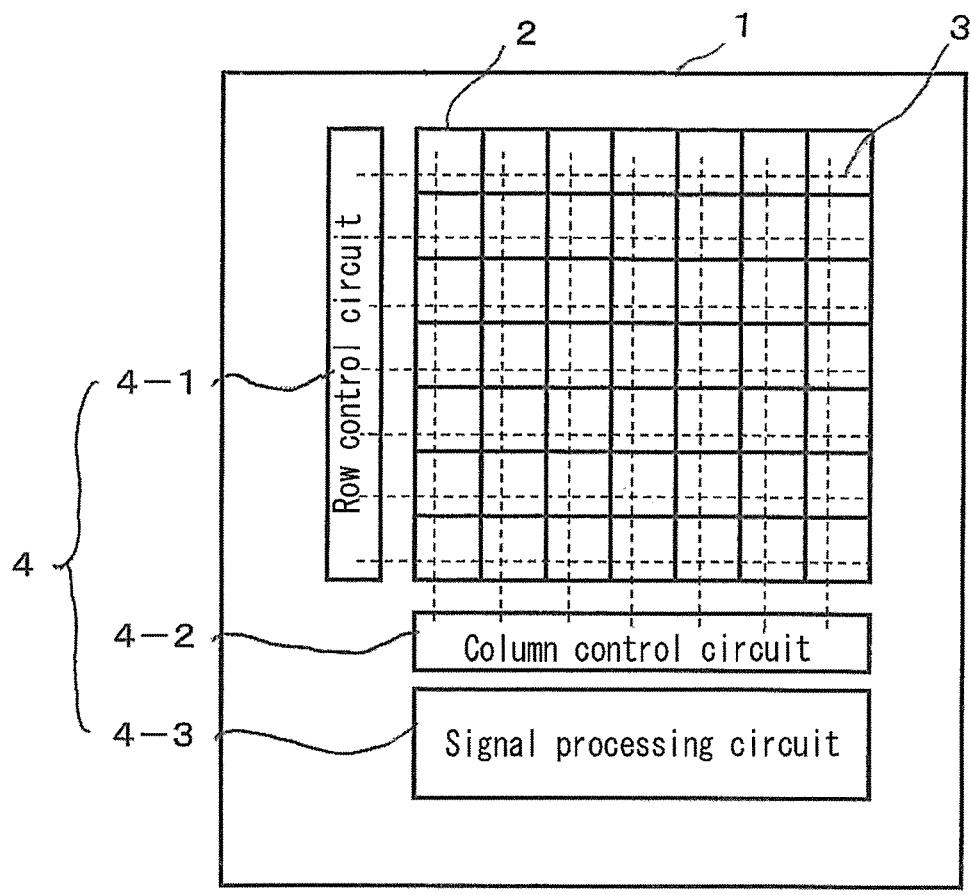
FIG. 1(a) is a plan view illustrating an outline structure of a photo detection device according to an embodiment of the present invention.

FIG. 1 is views illustrating an outline structure of a photo detection device 10 according to an embodiment of the present invention, (a) is a plan view, and (b) is a cross-sectional view.

In the photo detection device 10 of the present invention, multiple single photon avalanche diodes (SPADs), pixels 2 are arranged in an array on the same silicon chip 1, and around them, a CMOS transistor circuit 4 is formed comprising a Row control circuit 4-1, a Column control circuit 4-2 that drive these pixels 2, and a signal processing circuit 4-3 etc.

A thin film silicon (Si) layer on a surface of the silicon chip 1 is divided into a first region and a second region by a shallow trench isolation (STI) as explained in detail below, the pixels 2 arranged in an array are formed in the first region, and the CMOS transistor circuit 4 is formed in the second region.

The respective pixels 2, the pixels 2 and the Row control circuit 4-1, and the pixels 2 and the Column control circuit 4-2 are connected by metal wires 3.

Figure 1B:
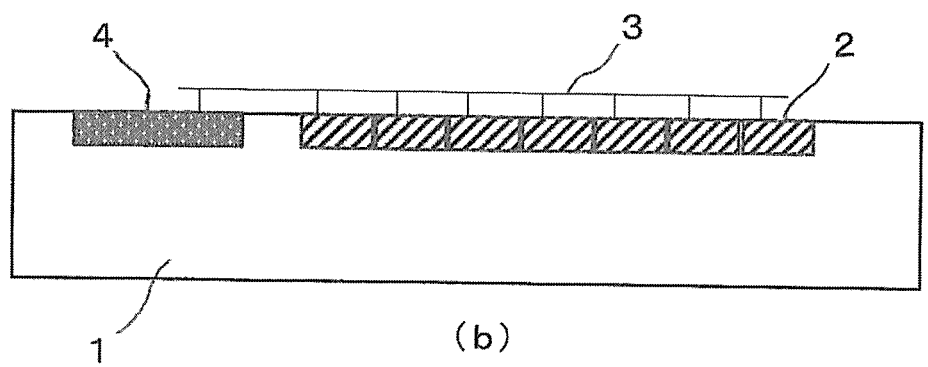
FIG. 1(b) is a cross-sectional view illustrating an outline structure of a photo detection device according to an embodiment of the present invention.
Figure 2:
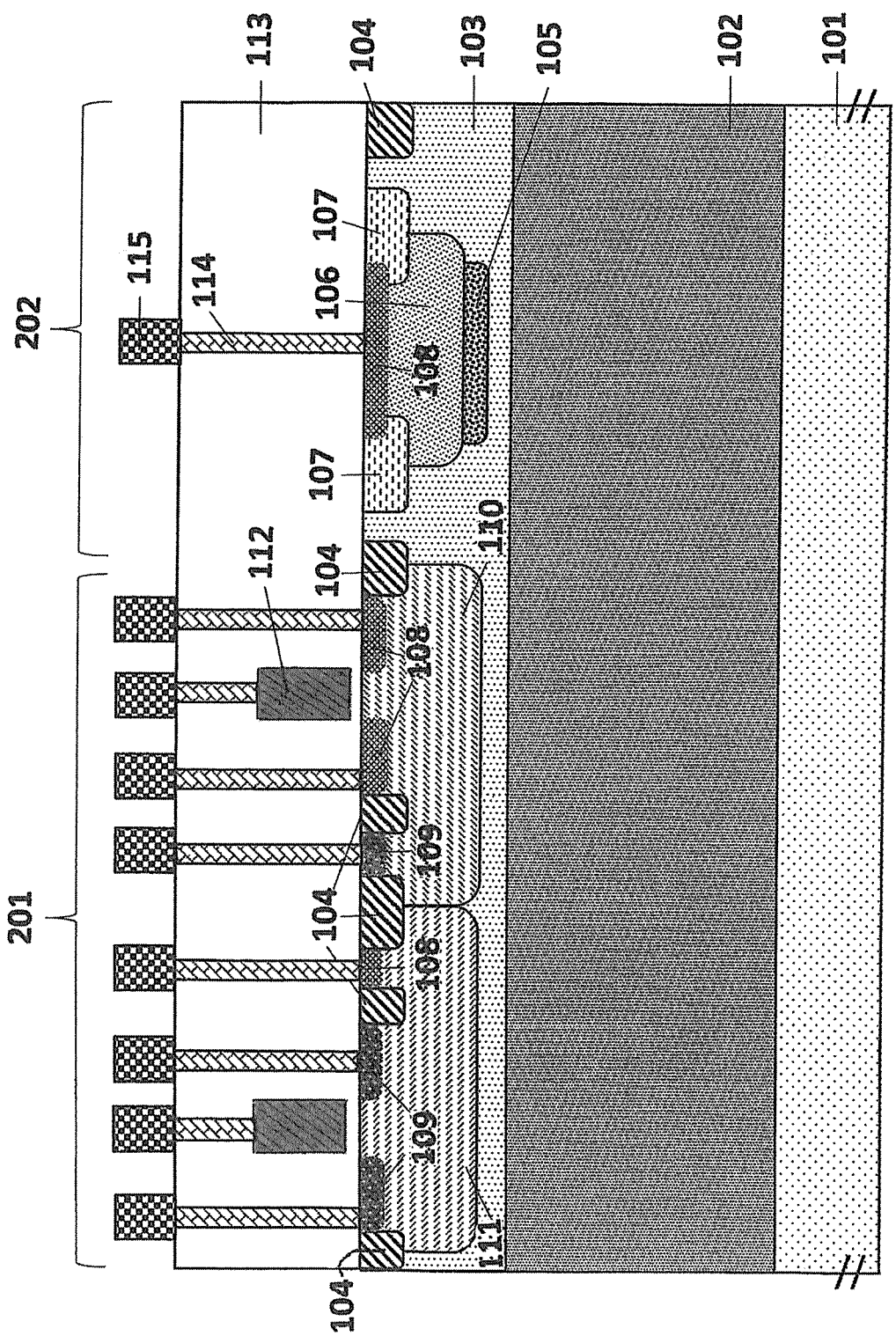
FIG. 2 is a schematic cross-sectional view illustrating details of the cross-sectional structure illustrated in FIG. 1(b).

FIG. 2 is a schematic cross-sectional view illustrating details of the cross-sectional structure illustrated in FIG. 1(b).

The photo detection device forms a photodiode (SPAD) 202 that detects an infrared single photon and a CMOS transistor circuit 201 that amplifies and processes a signal from the photodiode 202 by using a wafer in which a P-type doped P-type germanium epitaxial layer 102 is sandwiched by a P-type doped silicon substrate 101 and a P-type thin film silicon layer 103 as a raw material for a wafer process, and performing ion implantation and thermal treatment.

It is to be noted that although FIG. 2 illustrates by an example only one CMOS transistor circuit 201 and one photodiode (SPAD) 202, the photo detection device in fact, as illustrated in FIG. 1, comprises multiple SPADs 202 arranged in an array and a CMOS transistor circuitry for driving the SPADs 202 with multiple CMOS transistor circuits 201 combined.

Furthermore, by forming elements in the photodiode 202, elements in the CMOS transistor circuit 201, and wires between the photodiode 202 and the CMOS transistor circuit 201 by existing process manufacturing technique, all-in-one photo detection device capable of detecting an infrared single photon is realized including an amplifier capable of signal amplification and the CMOS transistor circuit 201 capable of signal processing.

The photodiode (SPAD) 202 is formed on the P-type silicon substrate 101, and the P-type silicon substrate 101 is a general purpose silicon wafer, doped with group III impurity such as boron, and its carrier concentration is $1 \times 10^{15}$ cm$^{-3}$ to $1 \times 10^{19}$ cm$^{-3}$, desirably $1 \times 10^{18}$ cm$^{-3}$.

The P-type germanium epitaxial layer 102 is a layer formed by epitaxial growth on the silicon substrate 101 and P-type doped, and its concentration is $1 \times 10^{15}$ cm$^{-3}$ to $1 \times 10^{16}$ cm$^{-3}$, desirably $7 \times 10^{15}$ cm$^{-3}$ and a thickness is 4 μm to 7 μm, desirably 5.5 μm.

On the P-type germanium epitaxial layer 102, the P-type thin film silicon layer 103 is formed whose concentration is $1 \times 10^{15}$ cm$^{-3}$ to $1 \times 10^{16}$ cm$^{-3}$, desirably $7 \times 10^{15}$ cm$^{-3}$ and whose thickness is 0.8 μm to 1.2 μm, desirably 1.0 μm. This P-type thin film silicon layer 103 is bonded to the P-type germanium epitaxial layer 102 in room temperature vacuum by surface activated bonding.

In addition, the P-type thin film silicon layer 103 is realized with a thin and uniform film thickness by smart-cut technique using hydrogen ion implantation.

For the photodiode 202 part, in the P-type thin film silicon layer 103 in descending order of depth, an APD P-well layer 105, an APD N-well layer 106, and N$^+$ diffusion layer 108 are formed by normal ion implantation technique, and a guard ring N-well layer 107 is arranged so as to surround the N$^+$ diffusion layer 108.

The APD P-well layer 105 is a P-type diffusion layer that is located at a depth of 0.7 μm to 0.8 μm from a surface of the P-type thin film silicon layer 103 and whose concentration is $1 \times 10^{16}$ cm$^{-3}$ to $1 \times 10^{17}$ cm$^{-3}$, desirably $7 \times 10^{16}$ cm$^{-3}$, and this layer controls to reduce an electric field at a junction between the P-type thin film silicon layer 103 and the P-type germanium epitaxial layer 102, to thereby reduce a dark current generated at this interface.

The APD N-well layer 106 is a N-type diffusion layer that is located at a depth of 0.2 μm to 0.7 μm from the surface of the P-type thin film silicon layer 103 and whose concentration is $1 \times 10^{15}$ cm$^{-3}$ to $1 \times 10^{16}$ cm$^{-3}$, desirably $7 \times 10^{15}$ cm$^{-3}$.

The APD P-well layer 105 and the APD N-well layer 106 form together a PN junction, and a high electric field enough to enable avalanche amplification is applied to this junction part.

In order to electrically connect to this APD N-well layer 106 and come into contact with the metal wire 3 at a sufficiently low resistance value, the N$^+$ diffusion layer 108 whose concentration is $1 \times 10^{19}$ cm$^{-3}$ to $1 \times 10^{21}$ cm$^{-3}$ is formed at a depth of 0.2 μm from the surface of the P-type thin film silicon layer 103. This N$^+$ diffusion layer 108 may be formed at the same time as an N$^+$ diffusion layer 108 that is used in the CMOS transistor circuit 201 part as mentioned below.

Furthermore, around the N$^+$ diffusion layer 108 of this photodiode, the guard ring N-well layer 107 whose concentration is $1 \times 10^{17}$ cm$^{-3}$ to $1 \times 10^{19}$ cm$^{-3}$ is arranged in order to prevent edge breakdown.

In addition, around each photodiode 202, an STI (Shallow Trench Isolation) layer 104 is put in order to perform electrical separation.

The CMOS transistor circuit 201 is basically made in the P-type thin film silicon layer 103 by existing CMOS manufacturing technology.

110 and 111 in FIG. 2 are respectively a P-well layer in which an N-channel transistor is formed and an N-well layer in which a P-channel transistor is formed. In respective well layers, the N$^+$ diffusion layer 108 and P$^+$ diffusion layer 109 that are highly concentrated diffusion layers and constitute a source and drain are arranged.

The N$^+$ diffusion layer 108 and the P$^+$ diffusion layer 109 also serve as well contacts connecting to the well layers 110 and 111 with low resistance. A gate electrode of a MOSFET is 112, each electrode of the transistor is connected by an electrode plug 114, and a circuit configuration of the photo detection device is made by metal wires 115.

Figure 3:
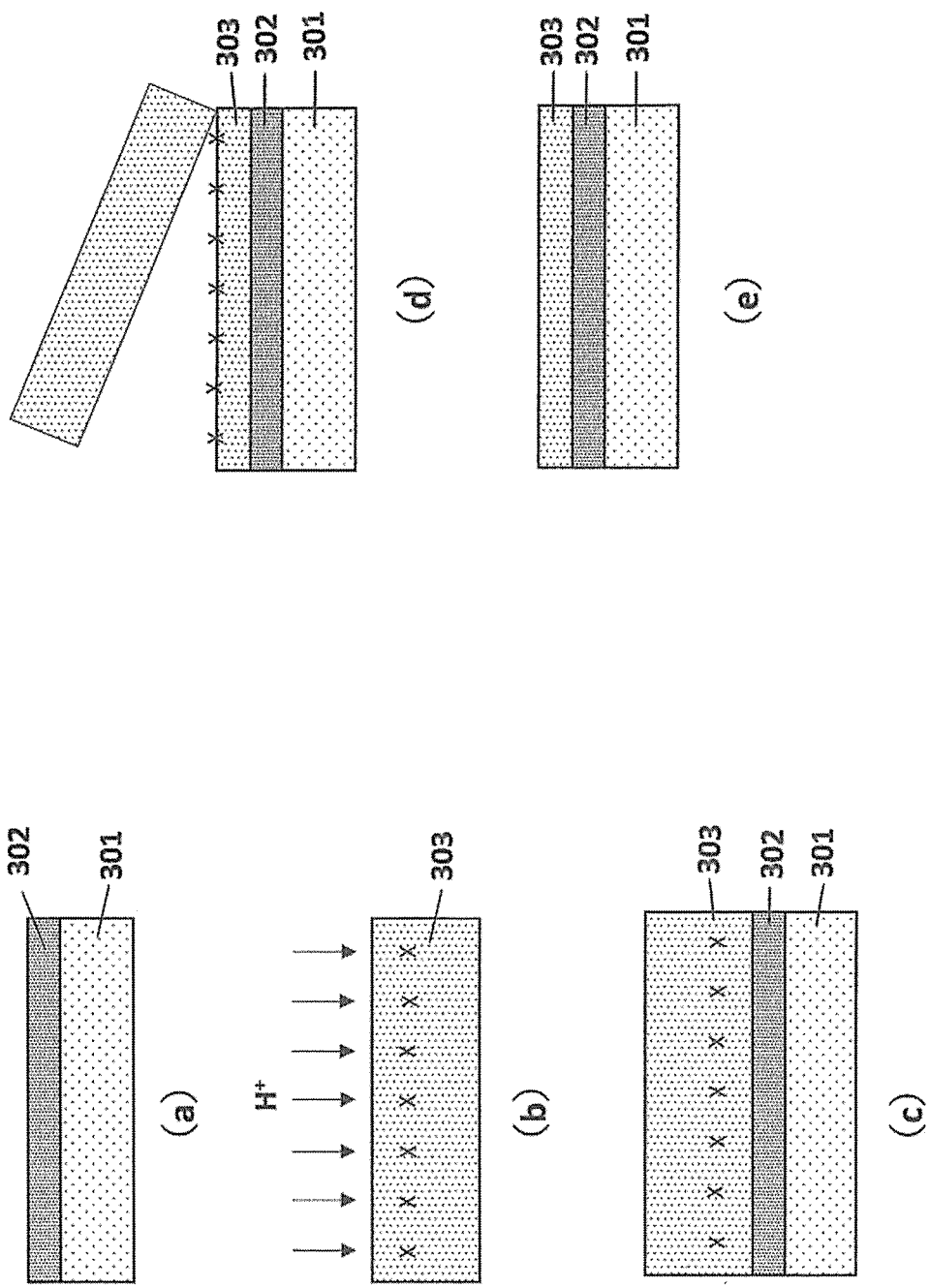
FIG. 3 is a view illustrating a method of manufacturing a wafer that is a basic material for manufacturing a photo detection device capable of detecting an infrared single photon according to the present invention.

FIG. 3 illustrates a method of manufacturing a wafer that is a basic material for manufacturing a photo detection device capable of detecting an infrared single photon according to the present invention.

First, as illustrated in FIG. 3(a), on a P-type silicon substrate 301 doped with existing group III impurity such as boron at a concentration of $1 \times 10^{15}$ cm$^{-3}$ to $1 \times 10^{19}$ cm$^{-3}$, desirably $1 \times 10^{18}$ cm$^{-3}$, a P-type germanium epitaxial layer 302 is formed by epitaxial growth.

At this time, a carrier concentration of the P-type germanium epitaxial layer 302 is $1\times10^{15}$ cm$^{-3}$ to $1\times10^{16}$ cm$^{-3}$, desirably $7\times10^{15}$ cm$^{-3}$ and a thickness is 4 μm to 7 μm, desirably 5.5 μm.

On the other hand, as illustrated in FIG. 3(b), on a P-type silicon substrate 303 doped with existing group III impurity such as boron at a concentration of $1\times10^{15}$ cm$^{-3}$ to $1\times10^{16}$ cm$^{-3}$, desirably $7\times10^{15}$ cm$^{-3}$, hydrogen ions (H$^+$) are implanted by a dose amount of $1\times10^{16}$ cm$^{-3}$ to $1\times10^{17}$ cm$^{-3}$, desirably $5\times10^{16}$ cm$^{-3}$, with an energy of 110 keV.

These two substrates 301 and 303 are bonded together in a vacuum by surface activated bonding technique as illustrated in FIG. 3(c). In this surface activated bonding, two substrates are introduced into a vacuum chamber not shown and each surface thereof is sputtered by Ar ions, and then the two substrates are mechanically bonded together by joining each surface together and applying a pressure of about 300 N for about 60 seconds.

By annealing the bonded substrates at a temperature of 400 to 600° C., cleavage occurs in a hydrogen ion implanted region as illustrated in FIG. 3(d) and thus a P-type silicon layer 303 of about 1 μm can be formed on the P-type germanium epitaxial layer 302.

Furthermore, chemical mechanical polishing (CMP) is applied to planarize a surface of the P-type silicon layer 303 and wet etching for removing surface damages is performed, and thus a wafer is completed as illustrated in FIG. 3(e) which wafer is a raw material for a wafer process for a photo detection device capable of detecting an infrared single photon.

FIG. 4 is outline cross-sectional views illustrating a wafer process for a photo detection device capable of detecting an infrared single photon.

Figure 4A:
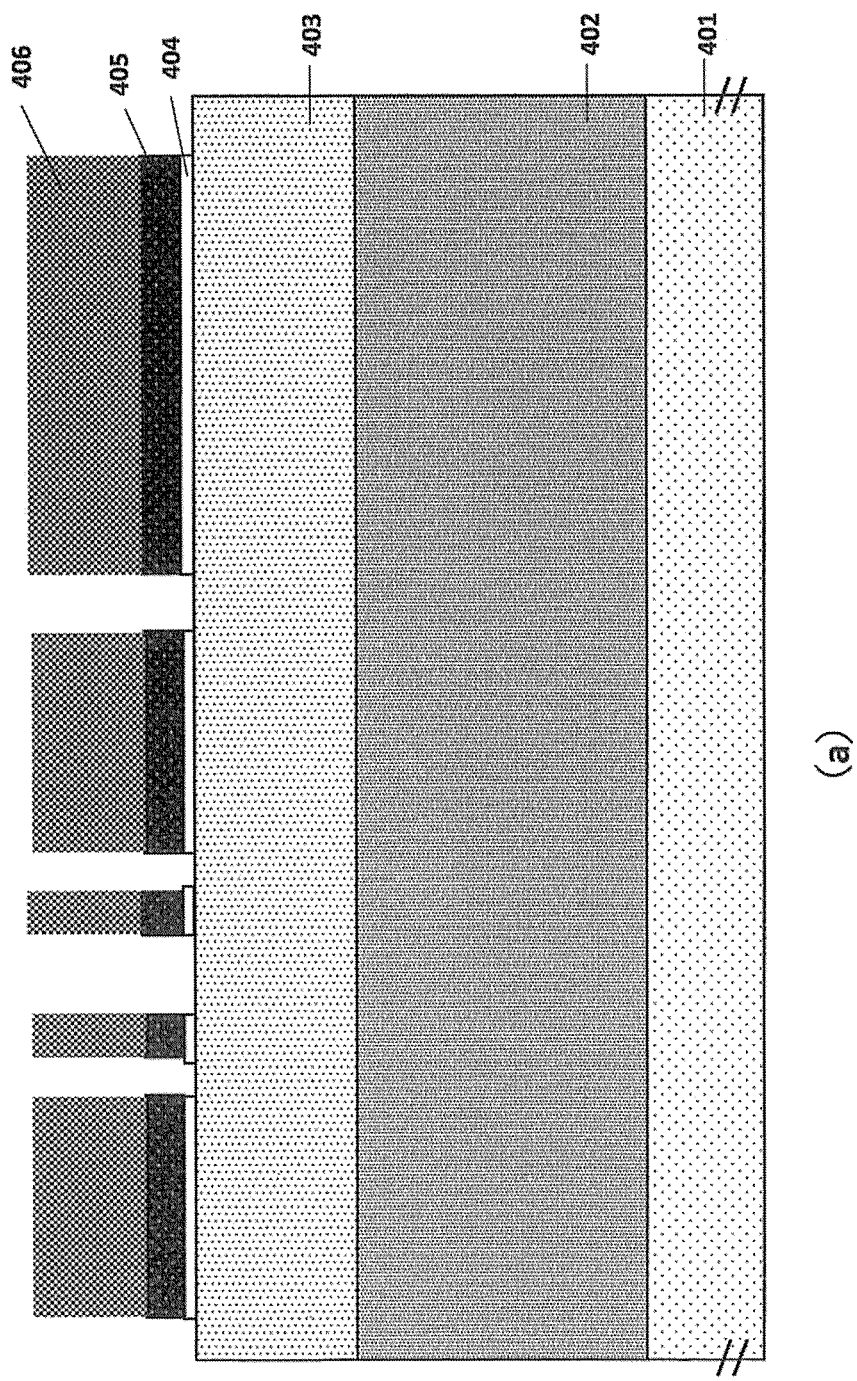
FIG. 4(a) is an outline cross-sectional view (part 1) illustrating a wafer process for a photo detection device capable of detecting an infrared single photon.

A wafer with germanium 402 sandwiched between silicons 401 and 403 is used as a starting material. After applying RCA cleaning etc. to this wafer, a pad oxide film 404 of 10 to 30 nm is grown by thermal oxidation. Furthermore, a silicon nitride film 405 of about 100 to 200 nm is deposited by a low-pressure CVD method. After that, a structure of FIG. 4(a) is obtained by patterning the silicon nitride film 405 and the pad oxide film 404 by existing photolithography technique and etching using a photoresist 406 as a mask.

Figure 4B:
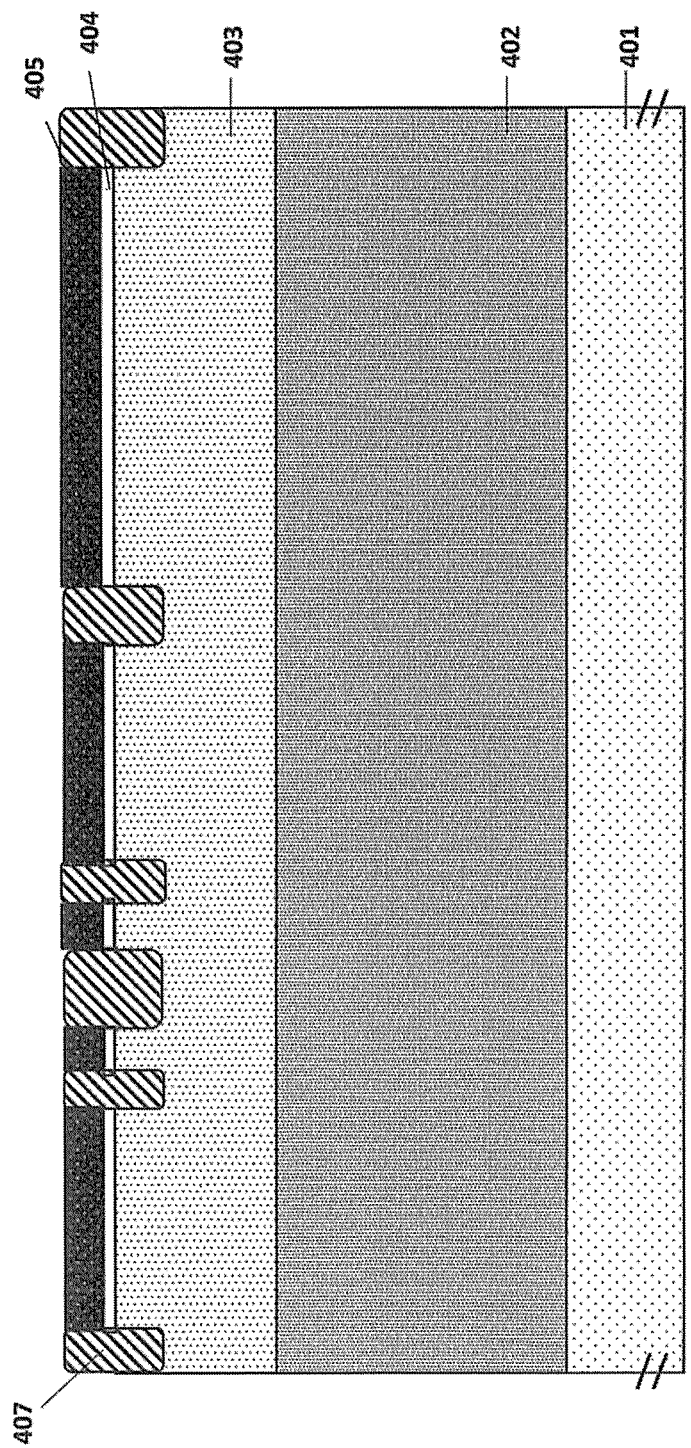
FIG. 4(b) is an outline cross-sectional view (part 2) illustrating a wafer process for a photo detection device capable of detecting an infrared single photon.

After that, by removing the photoresist 406 and etching using the silicon nitride film 405 as a hard mask, a shallow trench is formed in the silicon film 403. After RCA cleaning etc. is applied, a silicon oxide film of 10 to 20 nm is formed on a trench surface by thermal oxidation. Furthermore, by depositing a silicon oxide film of 500 to 700 nm by high density plasma HDP-CVD and planarizing it by chemical mechanical polishing (CMP), an STI oxide film 407 embedded in a trench for element isolation can be formed and a cross-sectional structure shown in FIG. 4(b) is obtained.

Figure 4C:
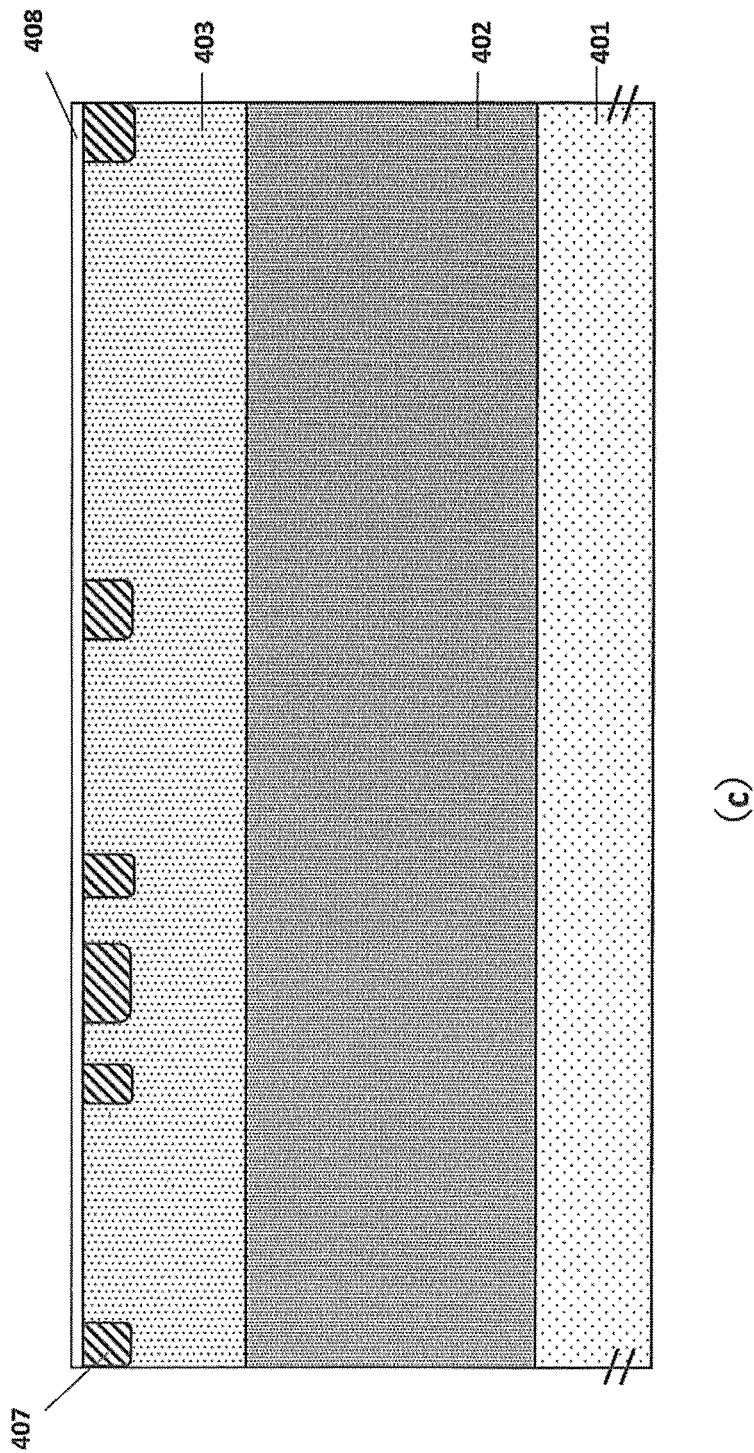
FIG. 4(c) is an outline cross-sectional view (part 3) illustrating a wafer process for a photo detection device capable of detecting an infrared single photon.

Together with removing the silicon nitride film 405 by hot phosphoric acid and removing the pad oxide film 404 by hydrofluoric acid, the height of the STI oxide film is adjusted to the silicon surface. Furthermore, a structure shown in FIG. 4(c) is obtained by applying 10 to 20 nm sacrificial oxidation by thermal oxidation. The steps up to this point conform to a normal CMOS LOGIC process. Followings will be additional steps specific to the photo detection device capable of detecting an infrared single photon.

Figure 4D:
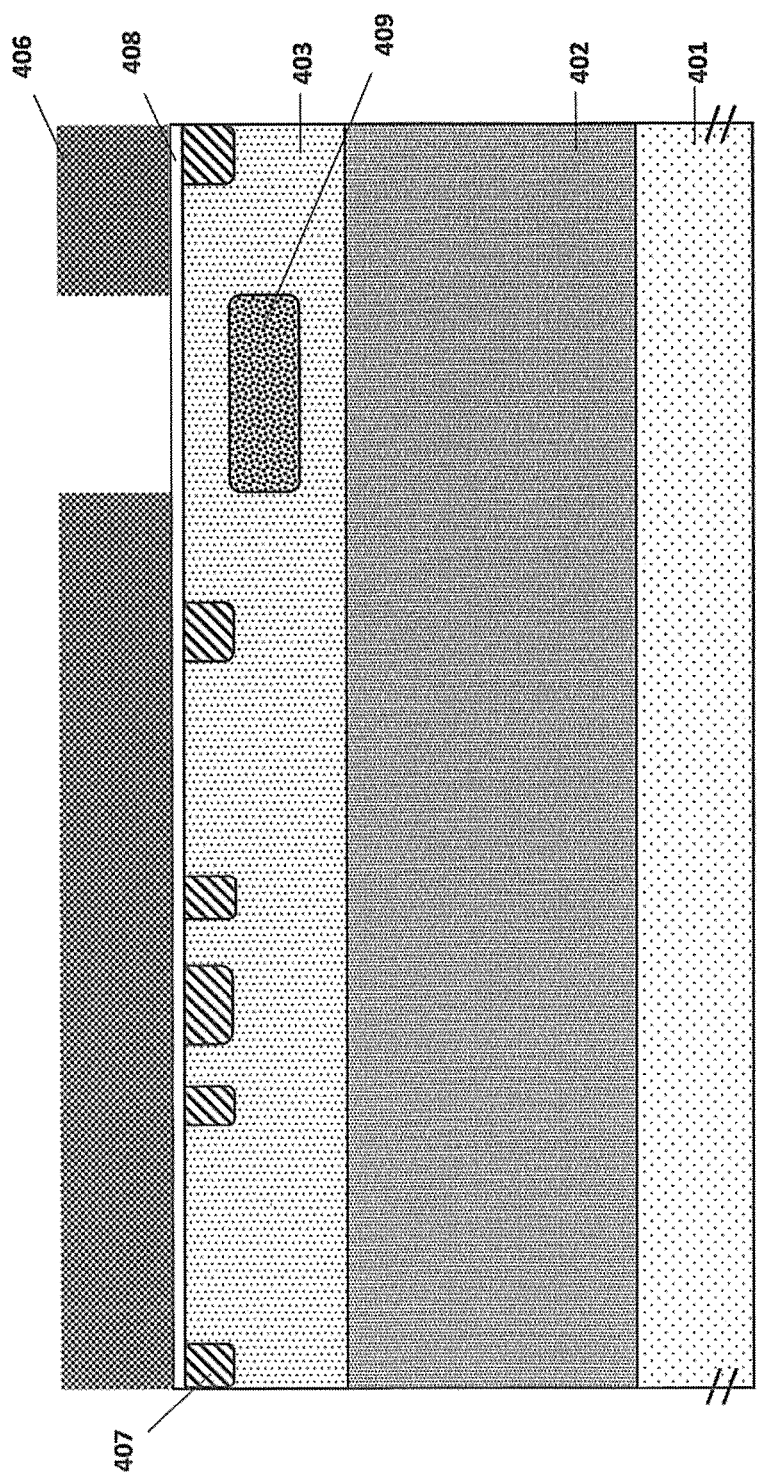
FIG. 4(d) is an outline cross-sectional view (part 4) illustrating a wafer process for a photo detection device capable of detecting an infrared single photon.

First, in order to form an APD P-well layer 409, using the photoresist 406 as a mask in normal photolithography technique, boron ions are implanted by a dose amount of $6\times10^{11}$ cm$^{-3}$, with an acceleration energy of 310 keV (FIG. 4(d)). After that, the photoresist 406 is removed.

Figure 4E:
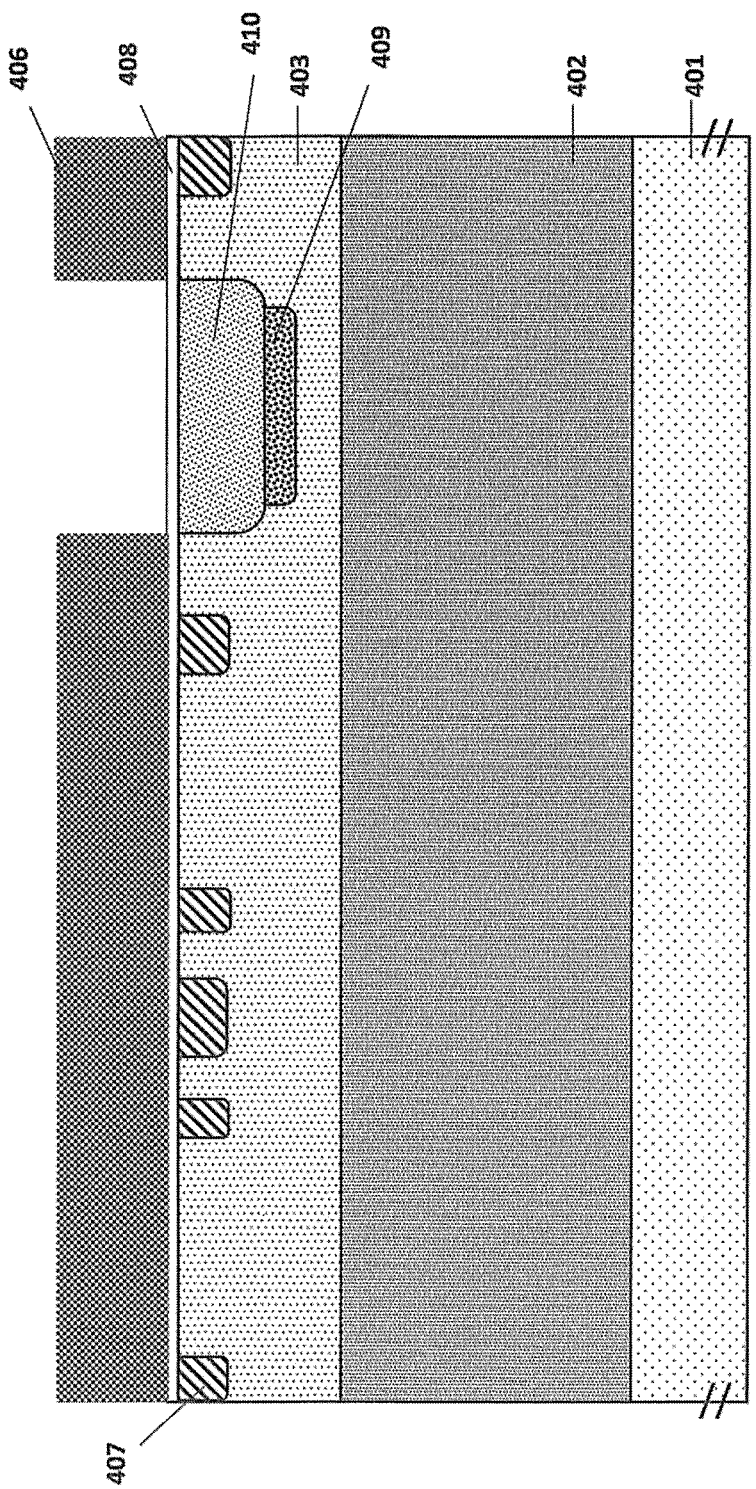
FIG. 4(e) is an outline cross-sectional view (part 5) illustrating a wafer process for a photo detection device capable of detecting an infrared single photon.

Similarly, in order to form an APD N-well layer 410, using the photoresist 406 as a mask in normal photolithography technique, phosphorus ions are implanted by a dose amount of $7\times10^{11}$ cm$^{-3}$, with an acceleration energy of 330 keV and by a dose amount of $2\times10^{15}$ cm$^{-3}$, with an acceleration energy of 90 keV (FIG. 4(e)). After that, the photoresist 406 is removed.

Figure 4F:
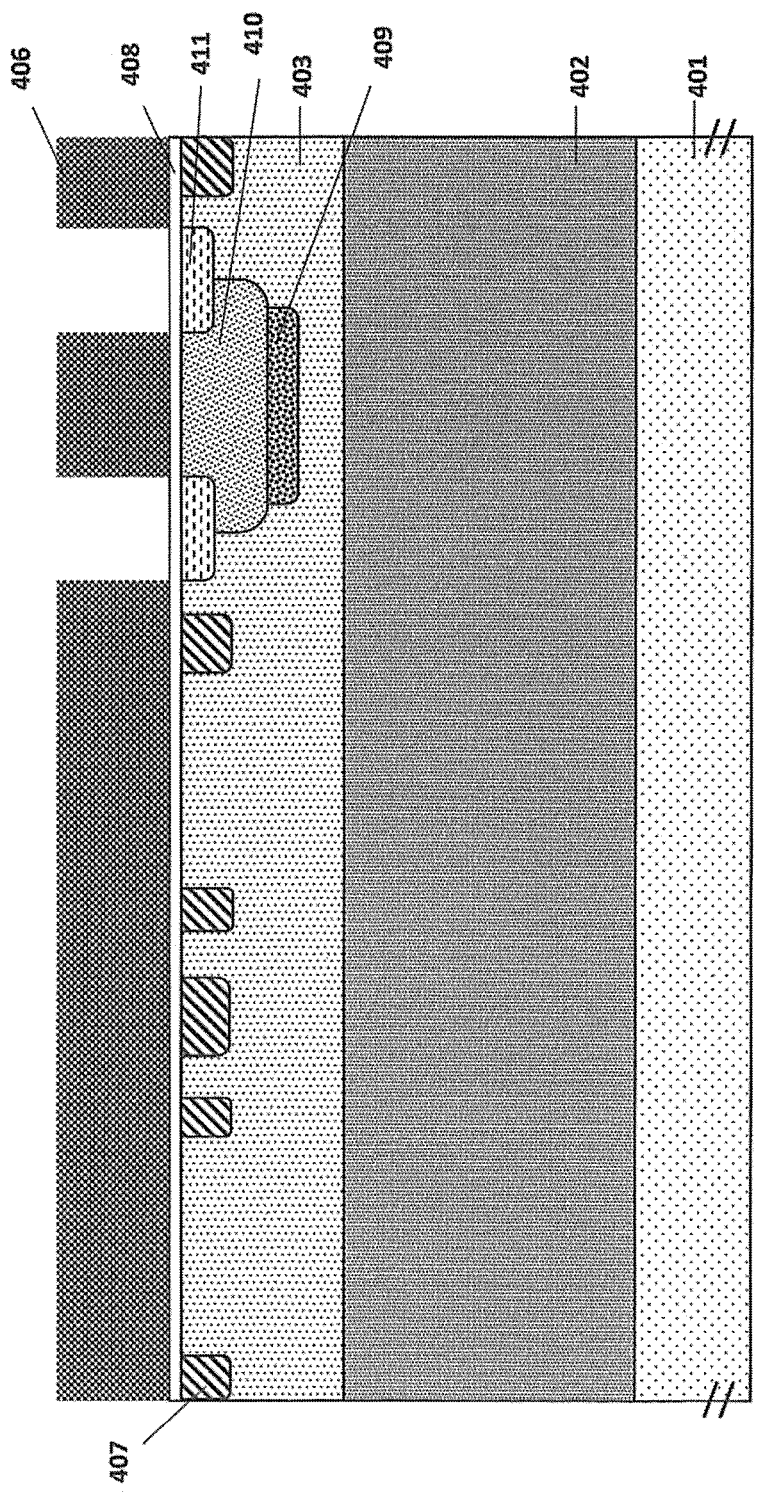
FIG. 4(f) is an outline cross-sectional view (part 6) illustrating a wafer process for a photo detection device capable of detecting an infrared single photon.

After that, in order to form a guard ring N-well layer 411, similarly using the photoresist 406 as a mask in normal photolithography technique, phosphorus ions are implanted by a dose amount of $4\times10^{11}$ cm$^{-3}$, with an acceleration energy of 70 keV and by a dose amount of $4\times10^{11}$ cm$^{-3}$, with an acceleration energy of 200 keV (FIG. 4(f)). After that, the photoresist 406 is removed.

The steps from the APD P-well photolithography step to this step are additional ones to a normal CMOS LOGIC process, which are necessary for manufacturing the photo detection device capable of detecting an infrared single photon. Since steps after this step will conform to the normal CMOS LOGIC process, detailed conditions thereof are omitted.

Figure 4G:
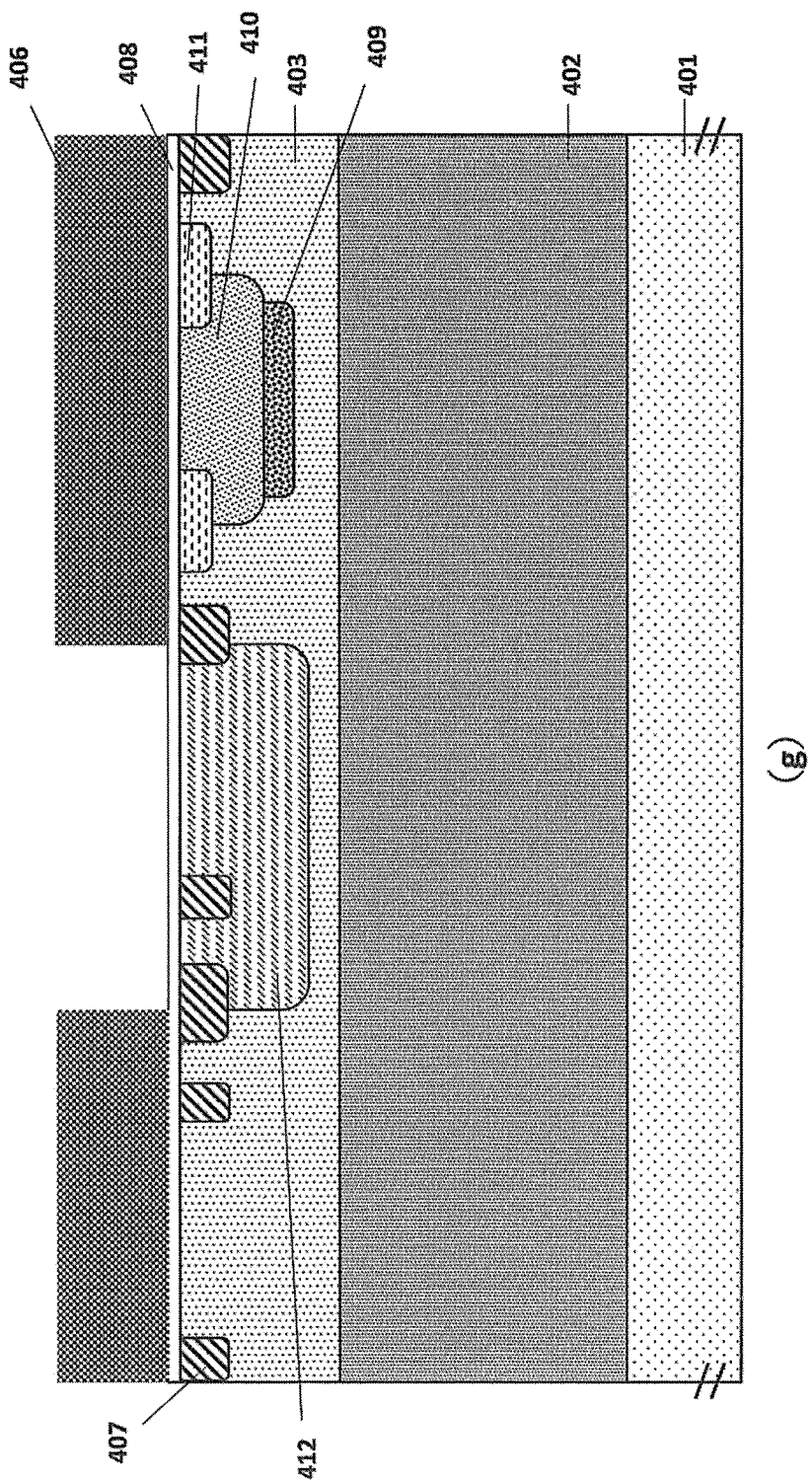
FIG. 4(g) is an outline cross-sectional view (part 7) illustrating a wafer process for a photo detection device capable of detecting an infrared single photon.

First, in order to form an N-channel transistor, also by normal photolithography technique and ion-implanting boron using the photoresist 406 as a mask, a Logic P-well layer 412 is formed (FIG. 4(g)). This step also includes boron or BF2 ion implantation to adjust a threshold of the N-channel transistor. After the ion implantation, the photoresist 406 is removed.

Figure 4H:
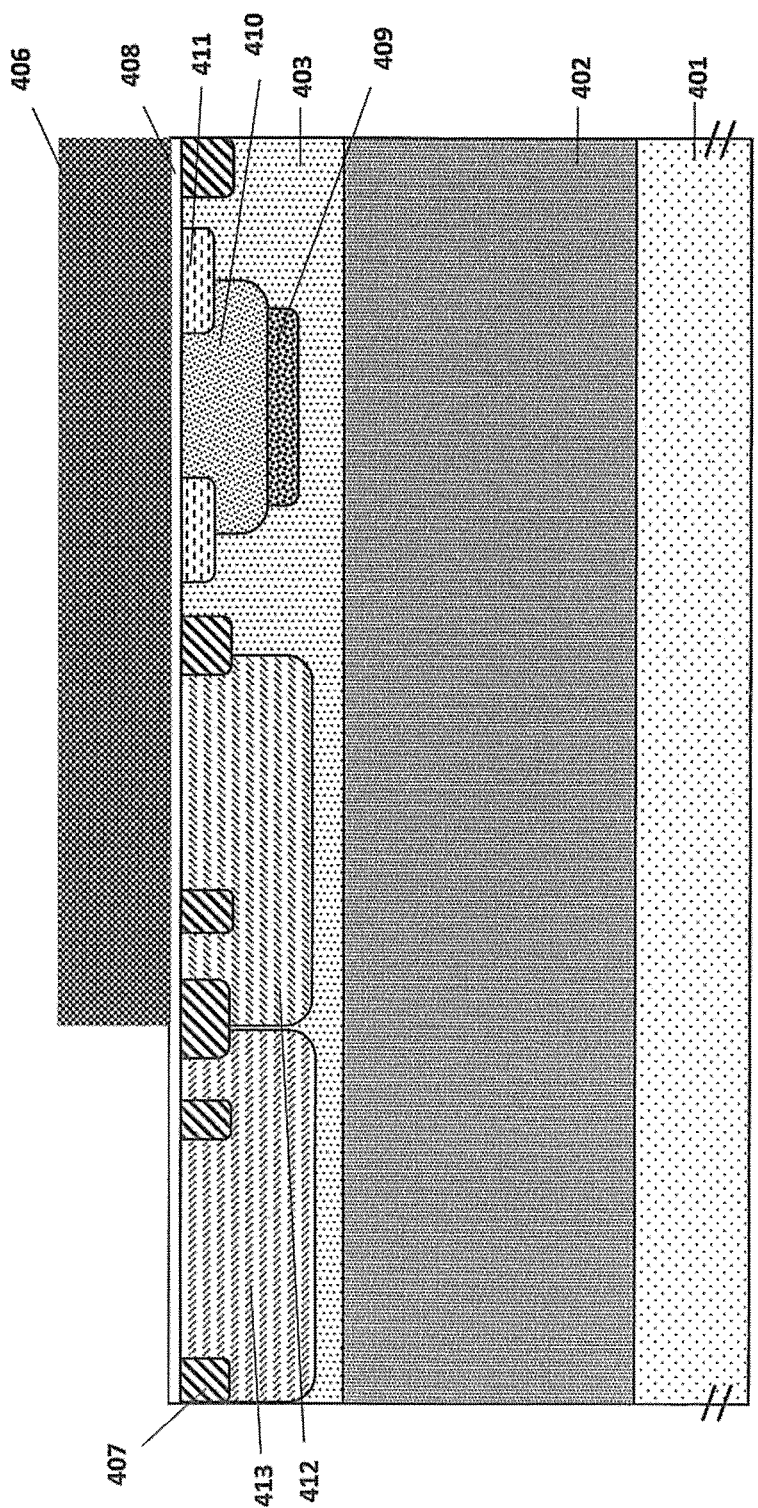
FIG. 4(h) is an outline cross-sectional view (part 8) illustrating a wafer process for a photo detection device capable of detecting an infrared single photon.
Figure 4I:
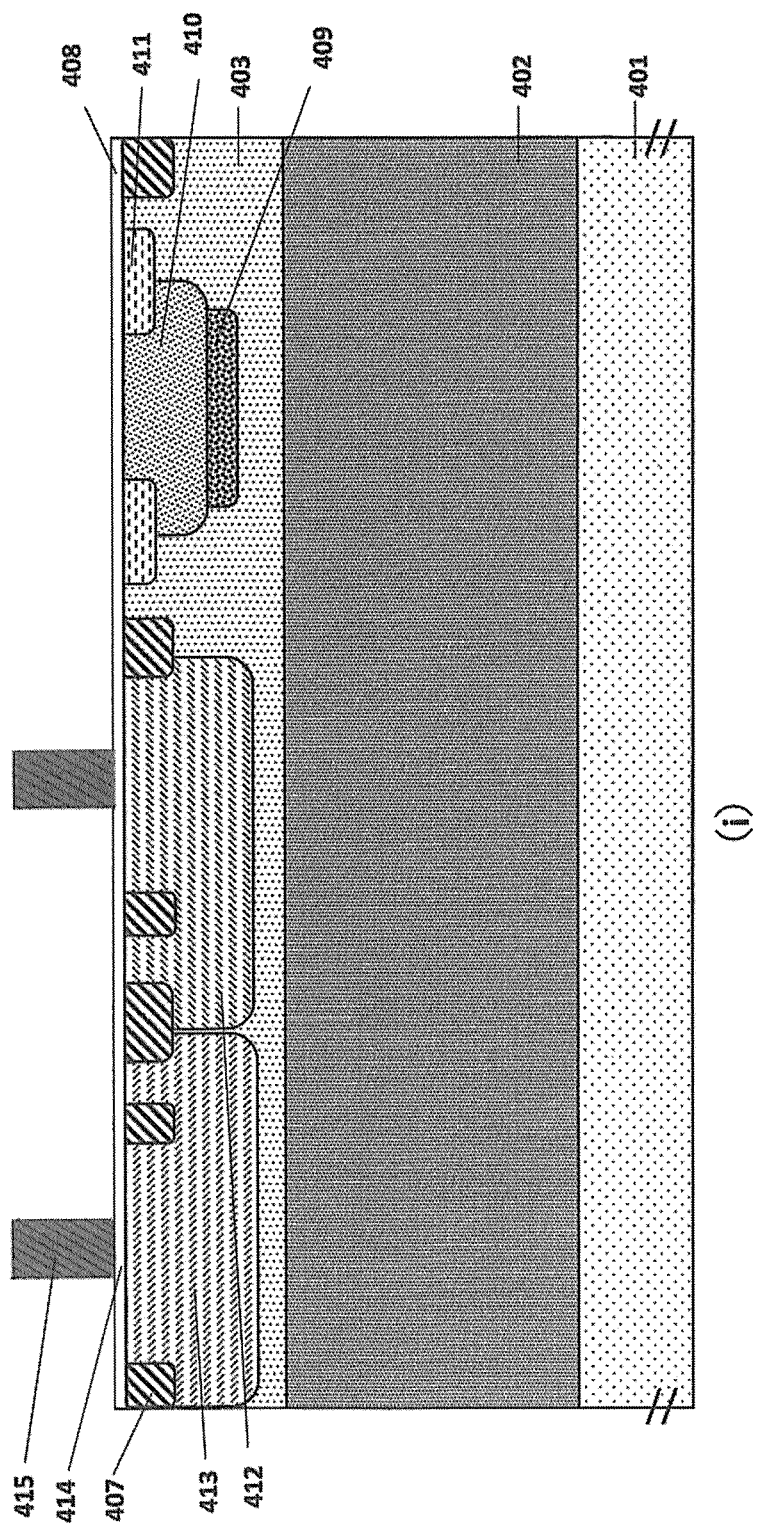
FIG. 4(i) is an outline cross-sectional view (part 9) illustrating a wafer process for a photo detection device capable of detecting an infrared single photon.

Furthermore, in order to form a P-channel transistor, also by normal photolithography technique and ion-implanting phosphorus using the photoresist 406 as a mask, a Logic N-well layer 413 is formed (FIG. 4(h)). This step also includes phosphorus ion implantation to adjust a threshold of the P-channel transistor. After the ion implantation, the photoresist 406 is removed.

After that, a sacrificial oxide film 408 is removed by hydrofluoric acid etc. After RCA pre-cleaning etc. is done, a gate oxide film 414 is formed by thermal oxidation. A polysilicon, which is to be a gate electrode 415, is deposited by low-pressure CVD, the gate electrode 415 is patterned and the photoresist 406 is removed by normal photolithography technique and etching technique, to obtain a structure of FIG. 4(i).

Figure 4J:
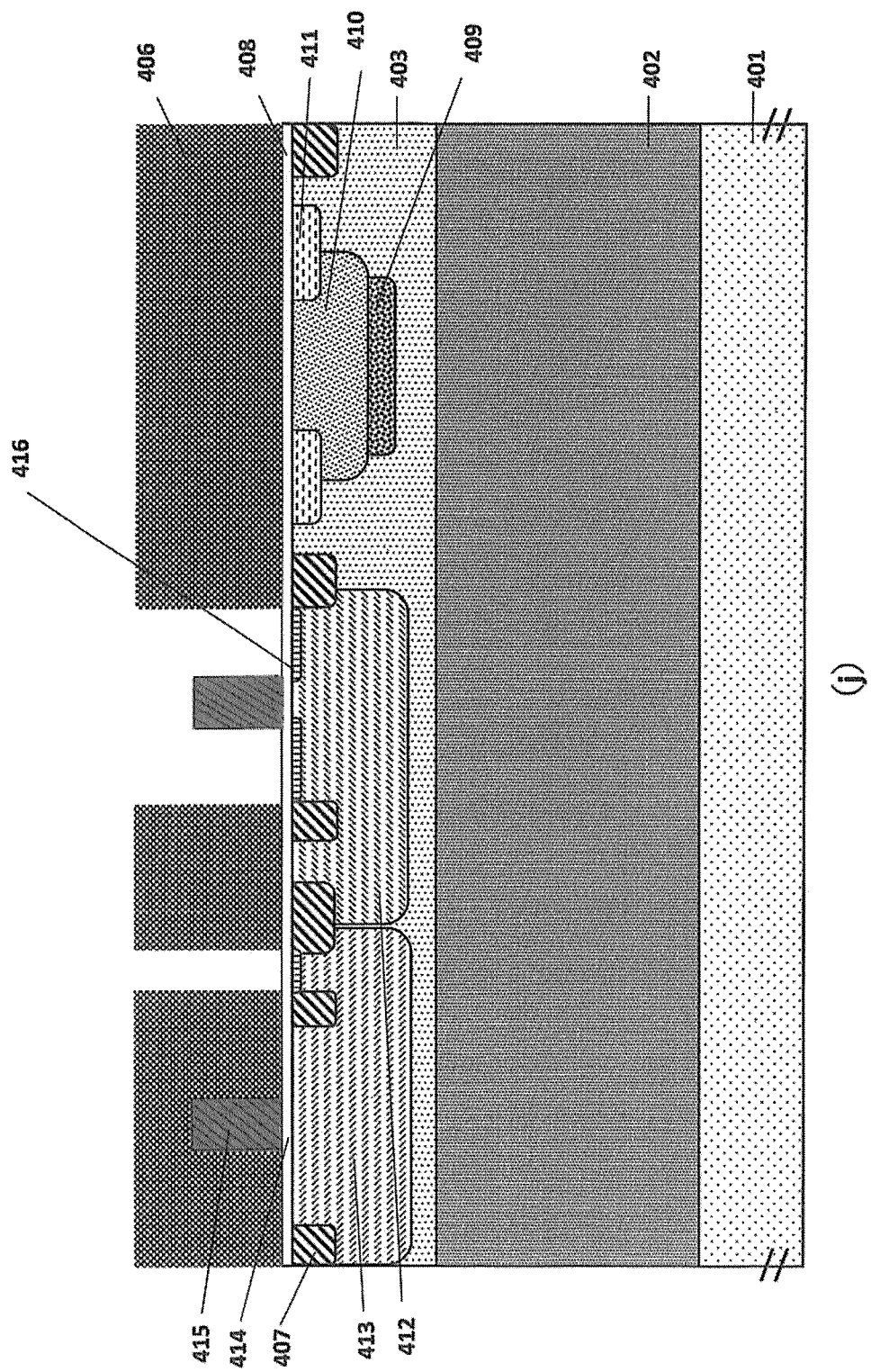
FIG. 4(j) is an outline cross-sectional view (part 10) illustrating a wafer process for a photo detection device capable of detecting an infrared single photon.

Next, in order to form an n$^-$ part 416 for drain electric field relaxation and suppression of short-channel effect of the N-channel transistor, after a pattern in which the photoresist 406 of the N-channel transistor part is opened, is formed by normal photolithography technique as illustrated in FIG. 4(j), arsenic ion implantation to form an LDD (Lightly Doped Drain) for drain electric field relaxation and boron or BF2 ion implantation to make a pocket for mitigation of short-channel effect are performed and the photoresist 406 is removed.

Figure 4K:
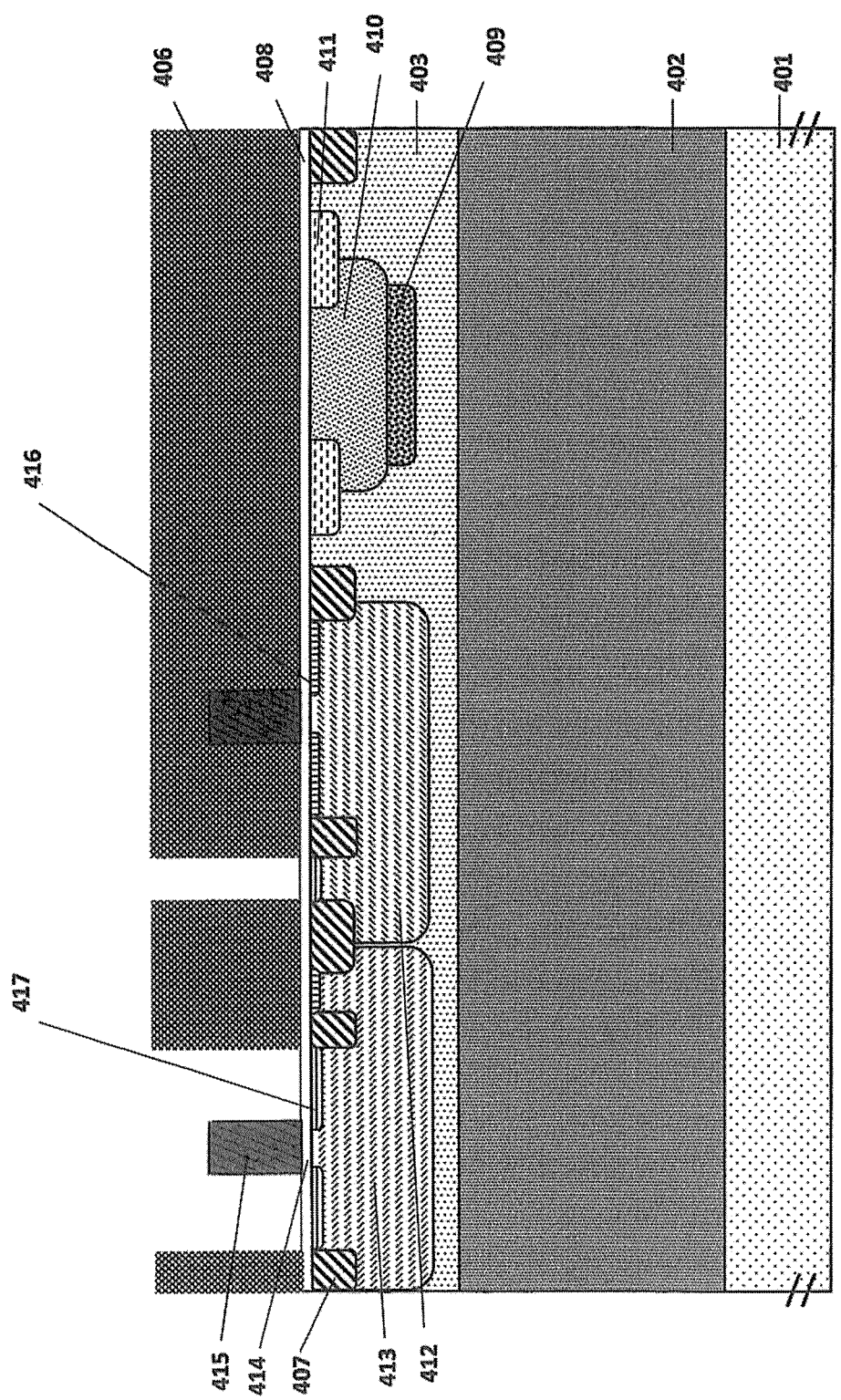
FIG. 4(k) is an outline cross-sectional view (part 11) illustrating a wafer process for a photo detection device capable of detecting an infrared single photon.
Figure 4I:
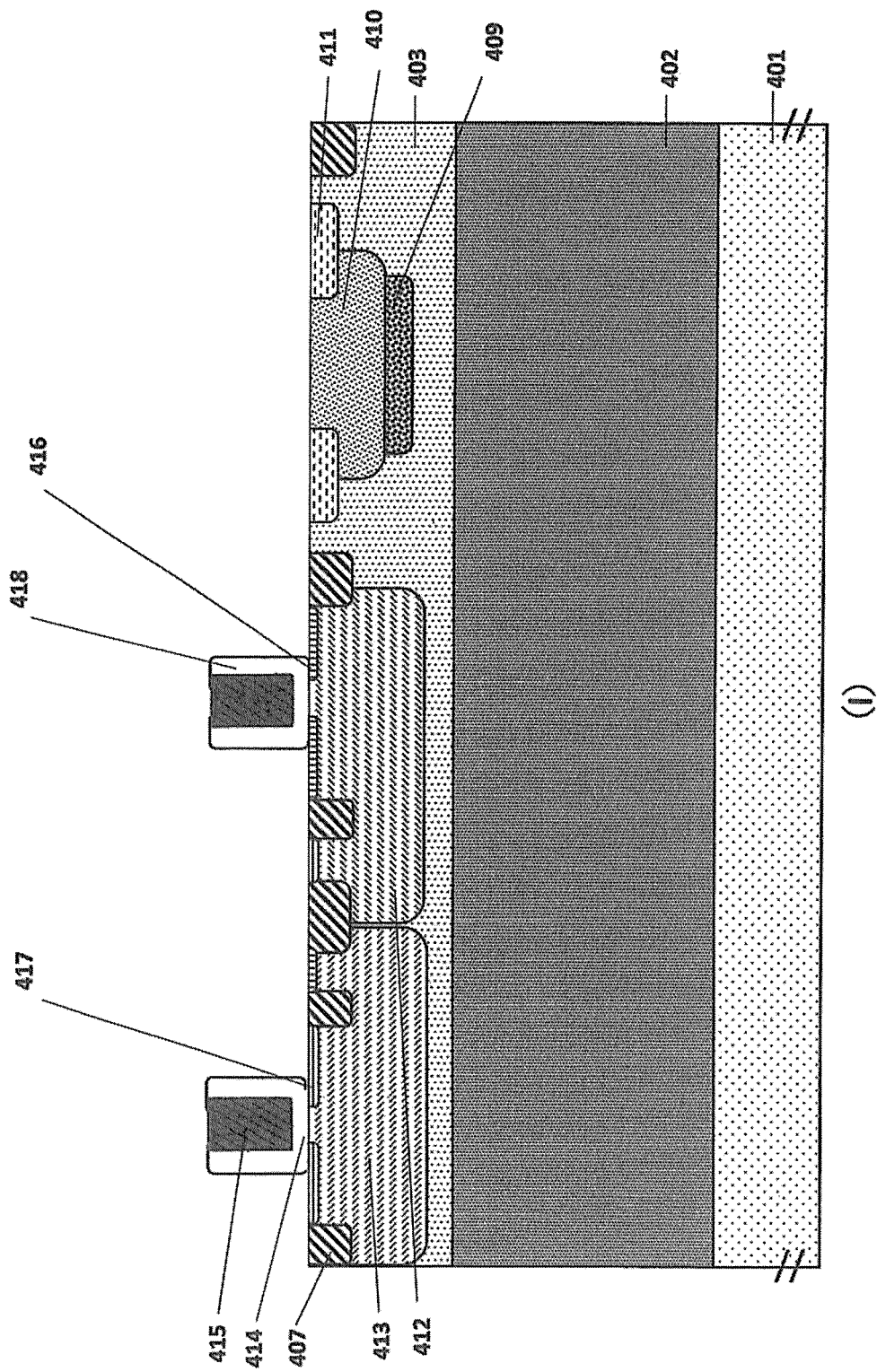

Similarly, in order to form a p$^-$ part 417 as illustrated in FIG. 4(k), after a pattern in which the photoresist 406 of the P-channel transistor part is opened, is formed, BF2 ion implantation as an LDD and phosphorus ion implantation as a pocket are performed and the photoresist 406 is removed. After that, a silicon oxide film is formed by a CVD method, and a sidewall spacer 418 is formed on a sidewall of the gate electrode 415 by anisotropic etching as illustrated in FIG. 4(l).

Figure 4M:
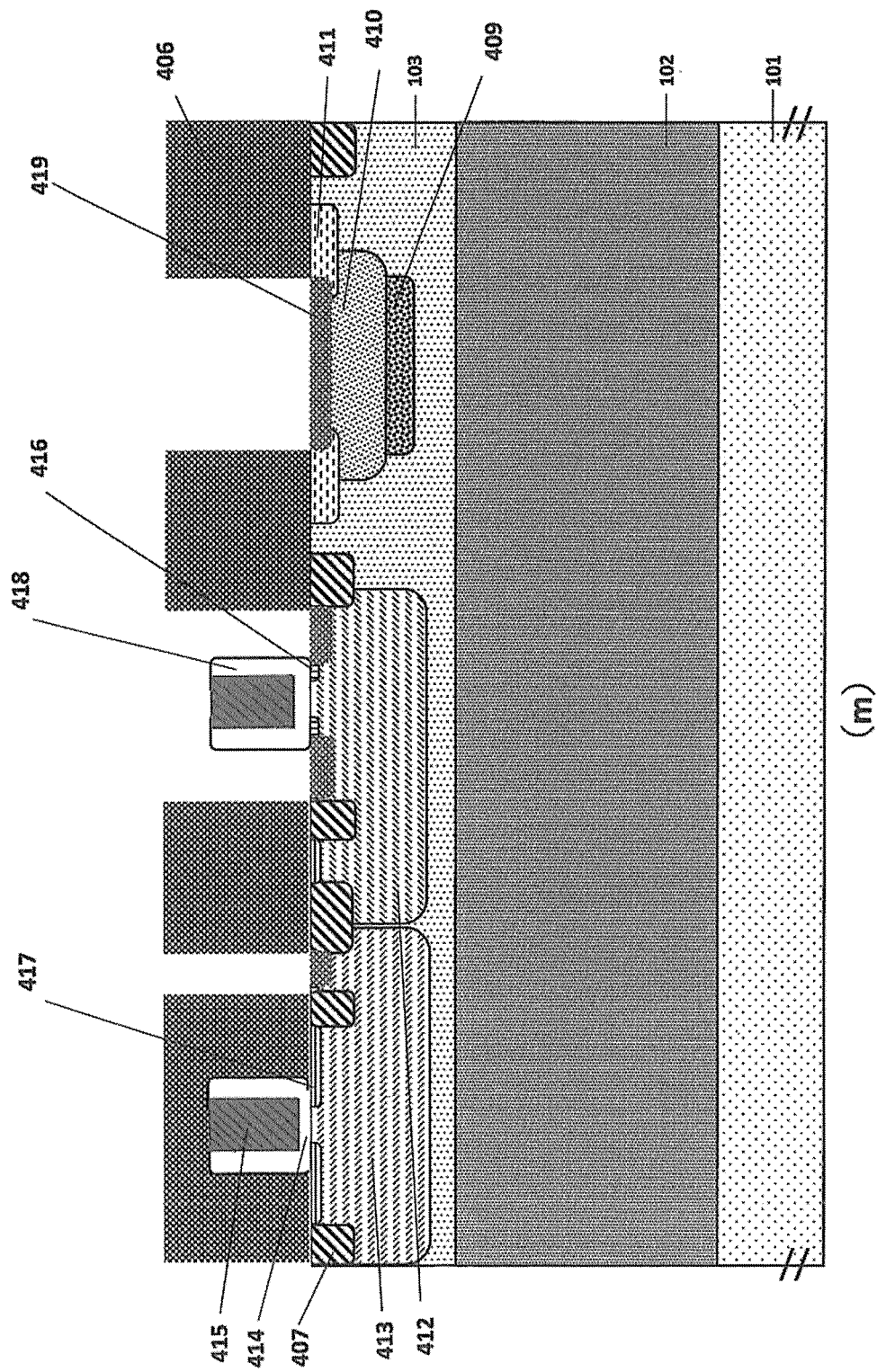
FIG. 4(m) is an outline cross-sectional view (part 13) illustrating a wafer process for a photo detection device capable of detecting an infrared single photon.

Next, in order to form an N$^+$ diffusion layer 419 of the N-channel transistor, a photoresist 406 pattern in which the N-channel transistor part is opened, is formed as illustrated in FIG. 4(m). At this time, since the N$^+$ diffusion layer 419 of APD is also formed at the same time, photoresist opening is also made in the upper part of APD. Arsenic ion implantation using this photoresist 406 as a mask forms a source and drain of the N-channel transistor and the N⁺ diffusion layer 419 of APD.

Figure 4N:
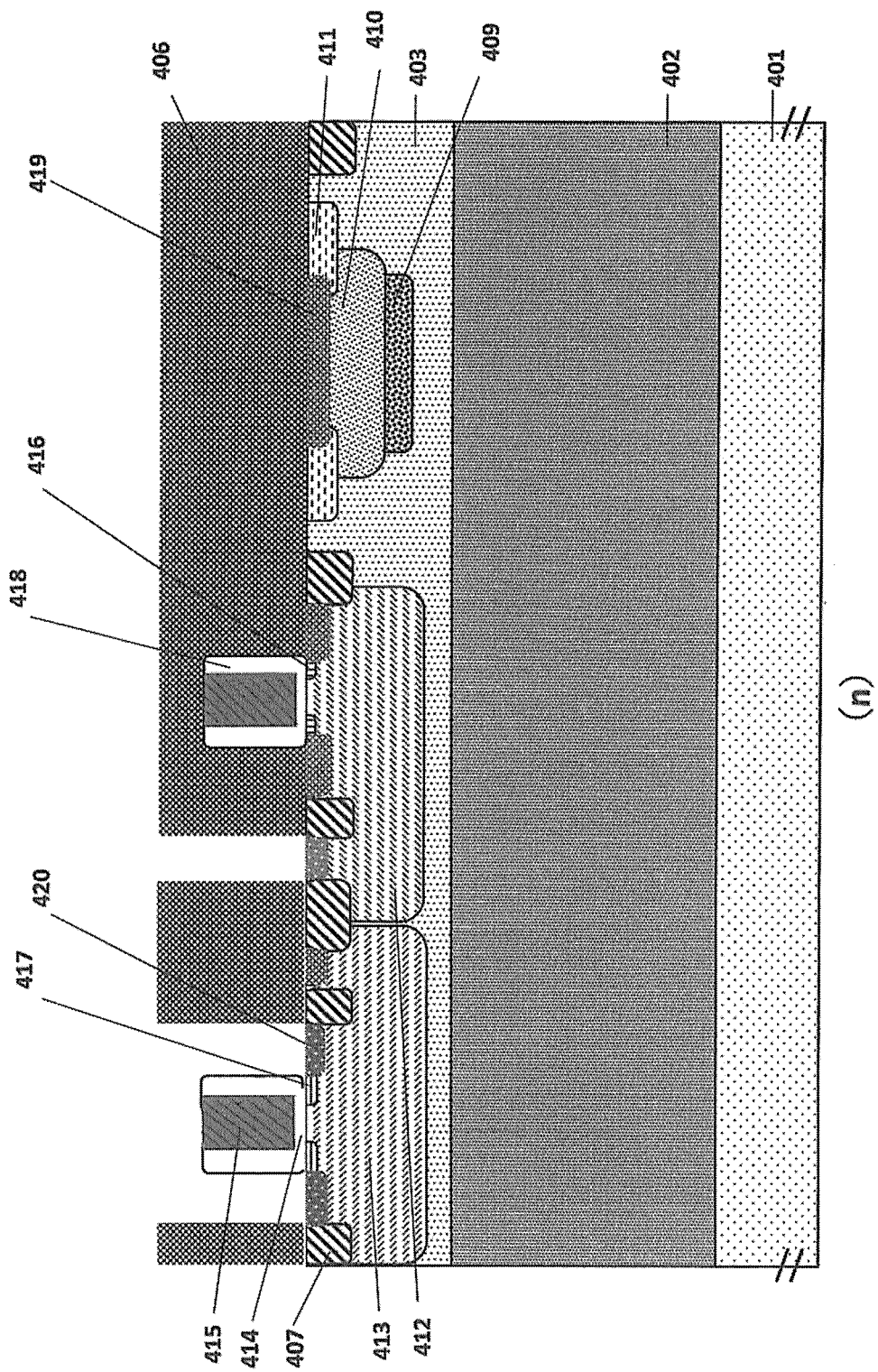
FIG. 4(n) is an outline cross-sectional view (part 14) illustrating a wafer process for a photo detection device capable of detecting an infrared single photon.

Similarly, in order to form a source and drain P⁺ diffusion layer 420 of the P-channel transistor, a photoresist 406 pattern in which the P-channel transistor part is opened, is formed as illustrated in FIG. 4(n), BF2 ion implantation is performed using this photoresist 406 as a mask, and the photoresist 406 is removed. Furthermore, a silicon oxide film is formed over the entire surface by CVD method etc. and patterning is performed so that silicon oxide film 422 is left on a region on which silicide is not desired to be formed in a subsequent salicide step for resistance reduction.

Figure 4O:
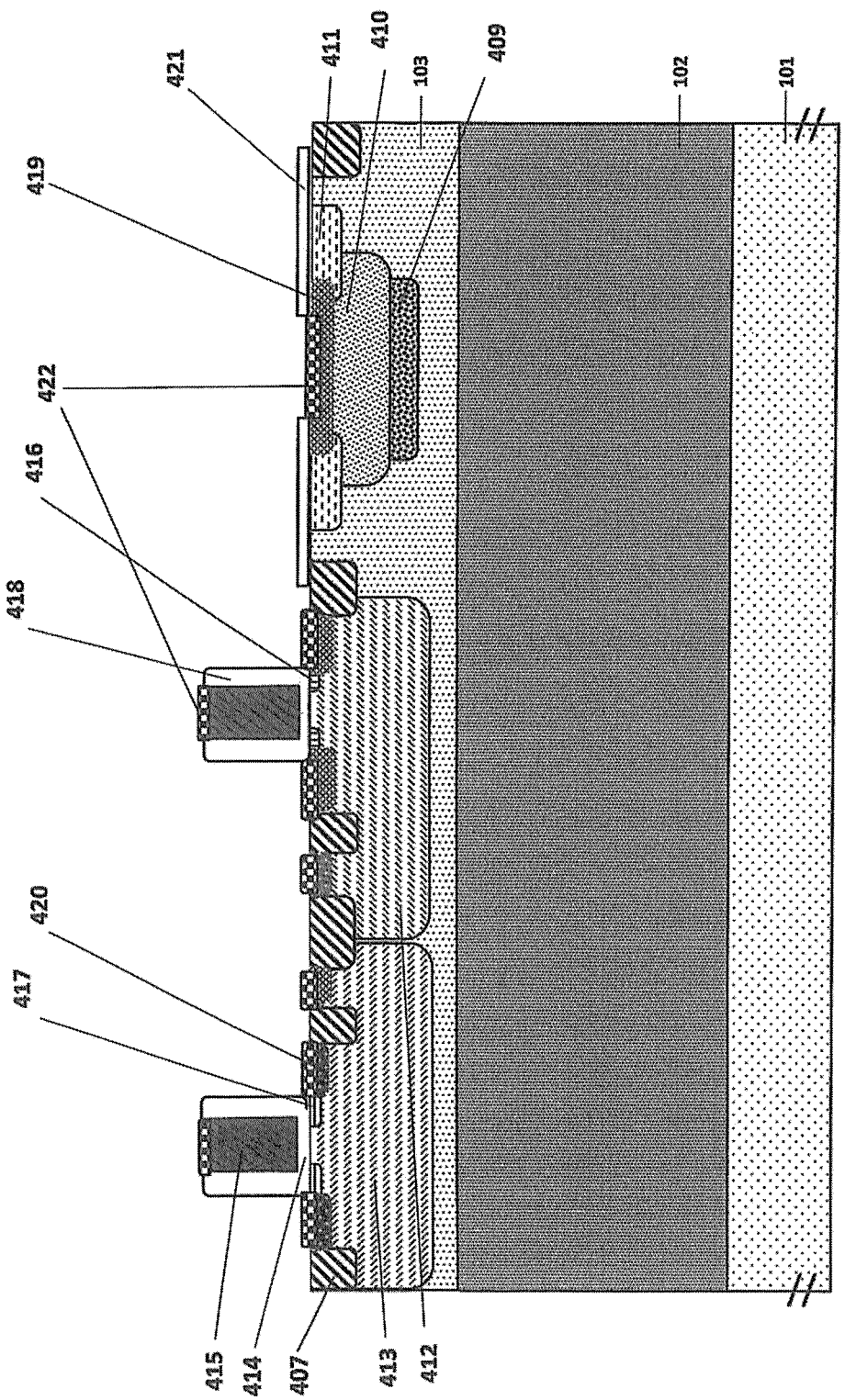
FIG. 4(o) is an outline cross-sectional view (part 15) illustrating a wafer process for a photo detection device capable of detecting an infrared single photon.

Although the region on which silicide is not desired to be formed, is in particular APD part in the present invention, it is configured, as illustrated in FIG. 4(o), such that silicide is formed on a part on which a contact is to be formed later even on APD part.

After that, cobalt etc. is spattered, the cobalt is reacted with silicon at a relatively low temperature of about 500° C., and untreated cobalt on the silicon oxide film is removed by selective etching. Furthermore, applying thermal treatment promotes silicidation and makes a low resistance salicide layer.

Figure 4P:
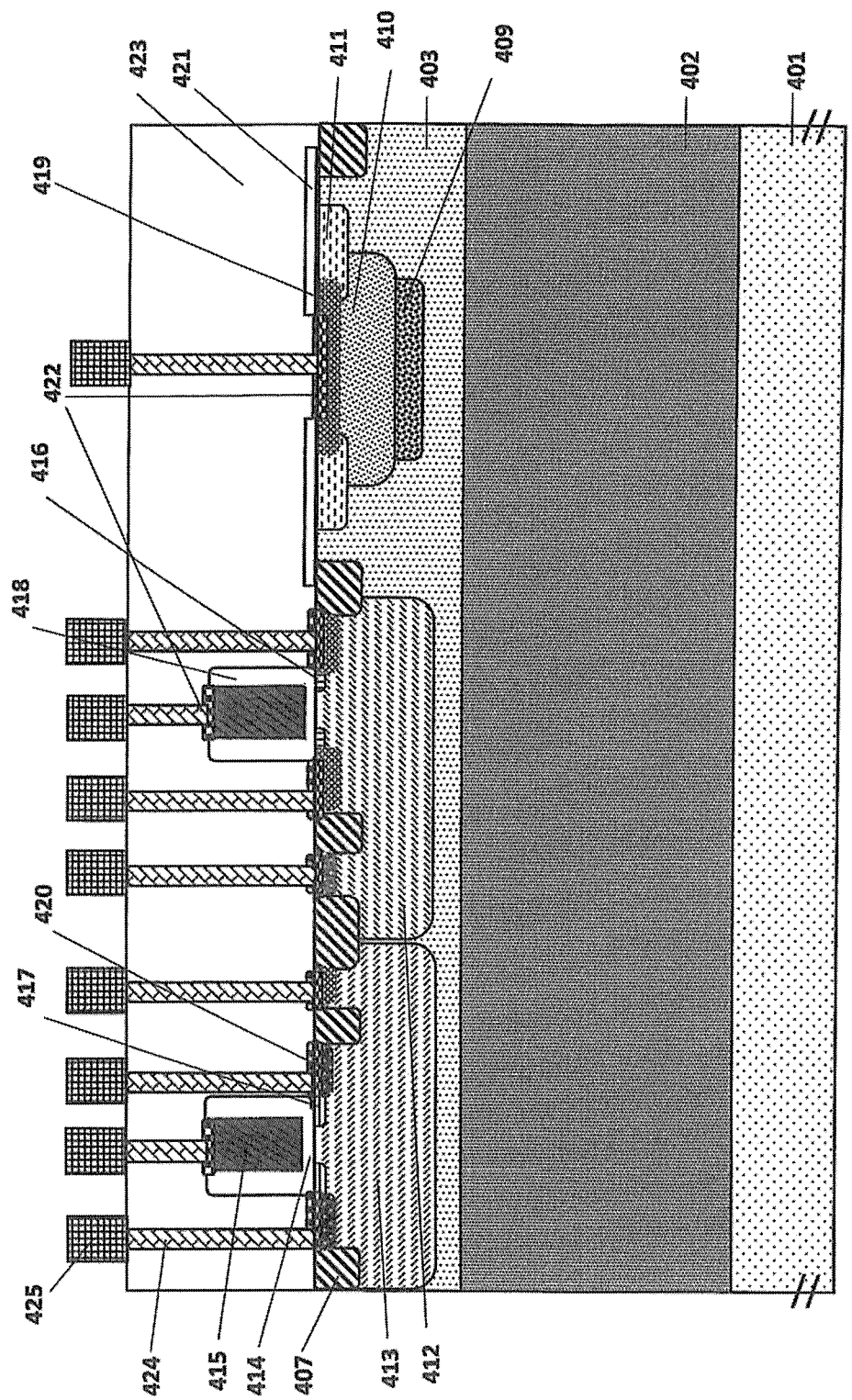
FIG. 4(p) is an outline cross-sectional view (part 16) illustrating a wafer process for a photo detection device capable of detecting an infrared single photon.

After that, a structure of FIG. 4(p) is obtained by formation of an existing interlayer insulation film 423, formation of a contact and a tungsten plug 424 in the contact, and formation of a first wiring layer 425. Although not illustrated here, after that, a multi-layer metal wiring structure is obtained by formation of a metal interlayer film, a via hole, and an upper metal wiring layer. Furthermore, after a protective film for chip protection is formed on the uppermost metal layer and the protective film on a pad is removed for electrical conduction, a wafer process for the photo detection device of the present invention is completed by performing backgrinding for making a wafer into a desired thickness, performing backside implantation of boron for lowering the resistance of the backside to form a backside P⁺ diffusion layer.

It is to be noted that, although in the above-mentioned embodiments, the P-type thin film silicon layer 103 is formed by surface activated bonding technique and smart-cut technique using hydrogen ion implantation as illustrated in FIG. 3, the present invention is not limited thereto, and it may be formed by a method of epitaxially growing silicon of about 1 μm on the P-type germanium epitaxial layer 102.

Figure 5:
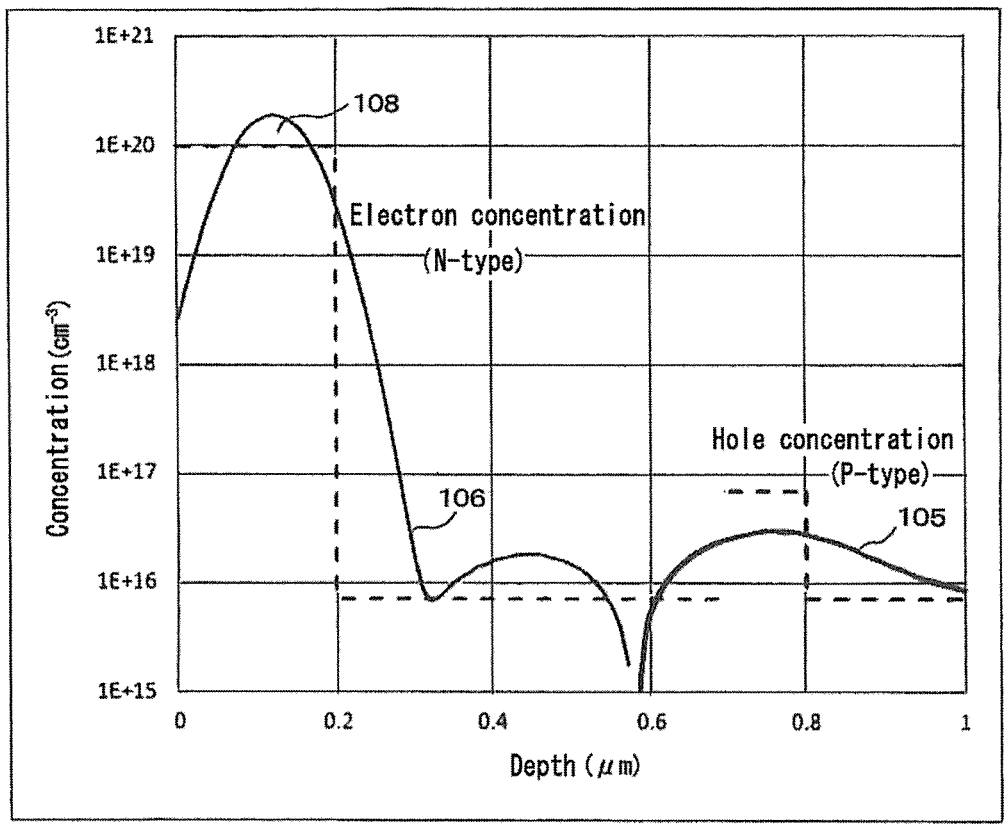
FIG. 5 is a view illustrating a carrier concentration profile obtained by a process simulation of a main part of the APD.

FIG. 5 illustrates a carrier concentration profile obtained by a process simulation of a main part of the APD that is formed by the above process. The horizontal axis designates a depth from the silicon film 403 surface, and the vertical axis designates concentration in the diffusion layer. It is found that the structure illustrated in FIG. 2 is substantially realized by the manufacturing method of the present invention.

Figure 6:
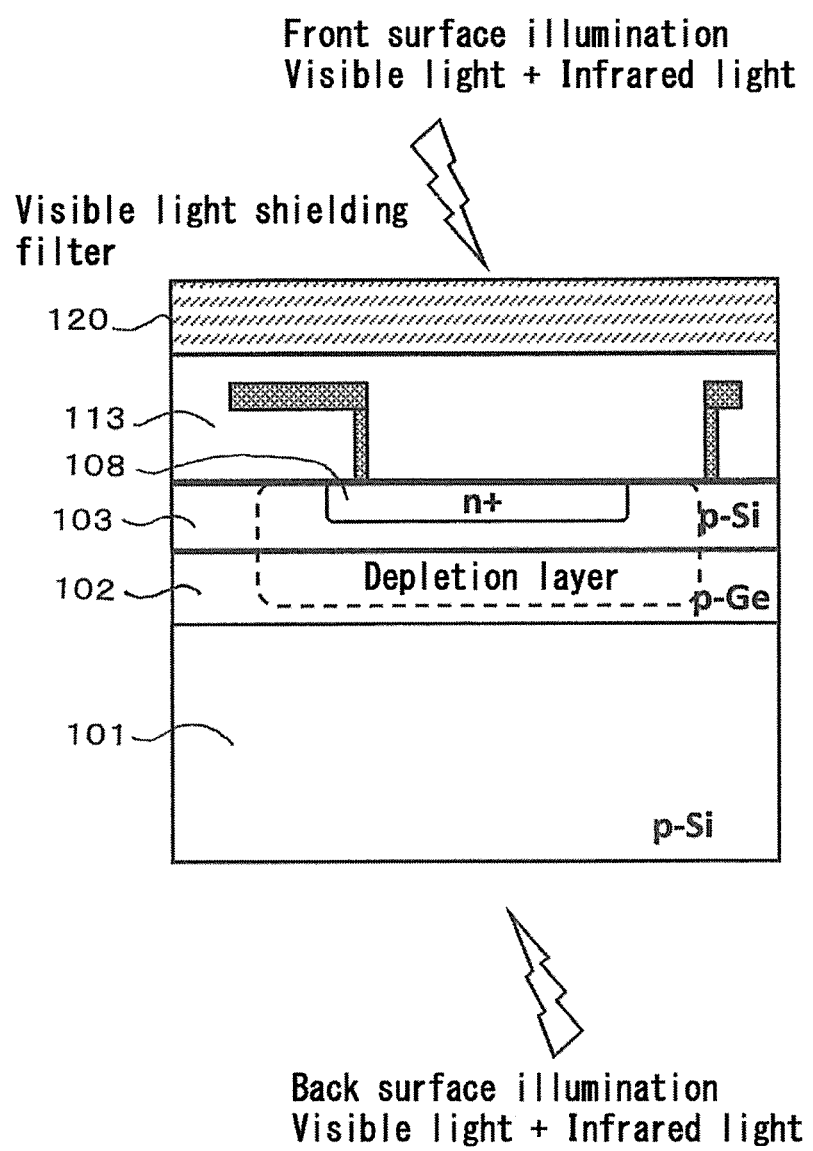
FIG. 6 is an explanatory view of an incident light illumination from a front surface and a back surface.

It is to be noted that a method of illuminating a SPAD in order to detect an incident light from an object includes a front surface illumination and a back surface illumination. In the SPAD according to the present invention, as illustrated in FIG. 6, an N⁺ junction 108 on the front side is as thin as 0.5 μm and there is a depletion layer in which a photoelectric effect occurs, in the P-type germanium epitaxial layer 102 under the junction. Although the P-type thin film silicon layer 103 absorbs a visible light, it is difficult for the thickness of 0.5 μm to absorb all visible light. Therefore, in the case of the front surface illumination, a visible light shielding filter 120 for shielding a visible light is needed.

Next, the back surface illumination is discussed.

The P-type germanium epitaxial layer 102 is as thin as about 5 μm, and the P-type silicon substrate 101 thereunder has to have the thickness of at least 200 μm for assuring mechanical strength of the chip. Without having to provide a visible light shielding filter on the back surface, a visible light is absorbed by this thick P-type silicon substrate and does not reach the depletion layer formed in the P-type germanium epitaxial layer 102.

On the contrary, an infrared light whose wavelength is about 1.1 μm, passes through the silicon (Si) and reaches the depletion layer. Therefore, an SPAD that selectively detects an infrared light only without a visible light shielding filter, can be realized. Therefore, it becomes possible to simplify the steps and reduce the cost because the step of making a filter is unnecessary.

DESCRIPTION OF REFERENCE NUMERALS 1 silicon chip
2 pixel
3 metal wire
4, 201 CMOS transistor circuit
4-1 Row control circuit
4-2 Column control circuit
4-3 signal processing circuit
photo detection device
101, 301 P-type silicon substrate
102, 302 P-type germanium epitaxial layer
103 P-type thin film silicon layer
104 STI layer
105, 409 APD P-well layer
106, 410 APD N-well layer
107, 411 guard ring N-well layer
108, 419 N⁺ diffusion layer
109, 420 P⁺ diffusion layer
110, 111 well layer
112, 415 gate electrode
114 electrode plug
115 metal wiring
120 visible light shielding filter
202 photodiode
303 P-type silicon substrate, P-type silicon layer
401 silicon
402 germanium
403 silicon film
404 pad oxide film
405 silicon nitride film
406 photoresist
407 STI oxide film
408 sacrificial oxide film
412 Logic P-well layer
413 Logic N-well layer
414 gate oxide film
416 n⁻ part
417 p⁻ part
418 sidewall spacer
422 silicon oxide film
423 interlayer insulation film
424 tungsten plug
425 wiring layer

The invention claimed is:

1. A photo detection device detecting an incident light from an object, comprising:
  (i) a P-type silicon (Si) substrate;
  (ii) a P-type germanium (Ge) layer formed on a first surface serving as a front surface of the P-type silicon (Si) substrate; and (iii) a P-type thin film silicon (Si) layer formed on the P-type germanium (Ge) layer,
(iv) wherein the P-type thin film silicon (Si) layer contains:
a first region in which multiple single photon avalanche diodes (SPADs) arranged in an array are formed, and
a second region in which a CMOS transistor circuit driving the SPADs is formed, and
the multiple single photon avalanche diodes (SPADs) formed in the first region are electrically separated from the CMOS transistor circuit formed in the second region by a Shallow Trench Isolation (STI) layer.

2. The photo detection device according to claim 1, configured to receive the incident light from a second surface serving as a back surface of the P-type silicon (Si) substrate.

* * * * *